(12) United States Patent
Ma et al.

(10) Patent No.: US 12,374,255 B2
(45) Date of Patent: Jul. 29, 2025

(54) DISPLAY PANEL AND DISPLAY APPARATUS HAVING DRIVING UNITS ELECTRICALLY CONNECTED TO SUB-PIXELS IN DISPLAY SUB-REGION WITH PHOTOSENSITIVE ELEMENT AND LOCATED OUT OF THE DISPLAY SUB-REGION

(71) Applicant: Wuhan Tianma Microelectronics Co., Ltd., Wuhan (CN)

(72) Inventors: Yangzhao Ma, Wuhan (CN); Hao Dai, Wuhan (CN)

(73) Assignee: Wuhan Tianma Microelectronics Co., Ltd., Wuhan (CN)

( * ) Notice: Subject to any disclaimer, the term of this patent is extended or adjusted under 35 U.S.C. 154(b) by 0 days.

(21) Appl. No.: 18/698,177

(22) PCT Filed: Oct. 27, 2022

(86) PCT No.: PCT/CN2022/127920
§ 371 (c)(1),
(2) Date: Apr. 3, 2024

(87) PCT Pub. No.: WO2024/050940
PCT Pub. Date: Mar. 14, 2024

(65) Prior Publication Data
US 2024/0404443 A1 Dec. 5, 2024

(30) Foreign Application Priority Data
Sep. 5, 2022 (CN) .......................... 202211094965.2

(51) Int. Cl.
*G09G 3/20* (2006.01)
*H10D 86/40* (2025.01)
*H10D 86/60* (2025.01)

(52) U.S. Cl.
CPC ............ *G09G 3/20* (2013.01); *H10D 86/441* (2025.01); *H10D 86/60* (2025.01);
(Continued)

(58) Field of Classification Search
CPC ............ G09G 3/20; G09G 2300/0465; G09G 2320/0233; G09G 2320/0242; H01L 27/124
See application file for complete search history.

(56) References Cited

U.S. PATENT DOCUMENTS

2019/0285886 A1* 9/2019 Yamashiro ....... G03G 15/04072
2019/0285949 A1* 9/2019 Chen .................... G02B 6/0053
(Continued)

FOREIGN PATENT DOCUMENTS

| CN | 111785761 A | 10/2020 |
|---|---|---|
| CN | 113421896 A | 9/2021 |
| CN | 114141851 A | 3/2022 |

OTHER PUBLICATIONS

International Search Report mailed Jun. 2, 2023, issued in corresponding international Application No. PCT/CN2022/127920, filed Oct. 27, 2022, 5 pages.

*Primary Examiner* — Sejoon Ahn
(74) *Attorney, Agent, or Firm* — Christensen O'Connor Johnson Kindness PLLC

(57) ABSTRACT

The present disclosure provides a display panel and a display apparatus, and relates to the technical field of displays. The display panel includes a display region; the display region includes a first display region and a second display region along a first direction; the first display region includes a first display sub-region and a second display sub-region along a second direction; the second display sub-region is configured to provide a photosensitive element; first sub-pixels are located in the first display sub-region, second sub-pixels are located in the second display sub-region, and third sub-pixels are located in the second display region; third driver units are located in the second display region, and electrically connected to the third sub-pixels in one-to-one correspondence; first driver units and second driver units are located in the first display sub-region, the first driver units are electrically connected to the first sub-pixels in one-to-one correspondence, and the second driver units are electrically connected to the second sub-pixels in one-to-one correspondence; in the first display region, orthographic projection of each of the driver units on a light exit surface of the display panel has an area of S1; and in the second display region, orthographic projection of each of the driver units on the light exit surface of the display panel has an area of S2, $½<S1:S2≤1$.

21 Claims, 14 Drawing Sheets

(52) U.S. Cl.
CPC .............. *G09G 2300/0465* (2013.01); *G09G 2320/0233* (2013.01); *G09G 2320/0242* (2013.01)

(56) References Cited

U.S. PATENT DOCUMENTS

| | | | |
|---|---|---|---|
| 2019/0286268 A1* | 9/2019 | Lin | G06F 3/0412 |
| 2019/0287466 A1* | 9/2019 | Yin | G09G 3/3406 |
| 2019/0288014 A1* | 9/2019 | Wang | G02F 1/13458 |
| 2019/0288048 A1* | 9/2019 | Kang | H10K 59/1216 |
| 2019/0288055 A1* | 9/2019 | Sakai | G09F 9/30 |
| 2019/0289308 A1* | 9/2019 | Mobasher | G06F 11/004 |
| 2023/0196957 A1* | 6/2023 | Hsieh | G09G 3/32 |

\* cited by examiner

DISPLAY PANEL AND DISPLAY APPARATUS HAVING DRIVING UNITS ELECTRICALLY CONNECTED TO SUB-PIXELS IN DISPLAY SUB-REGION WITH PHOTOSENSITIVE ELEMENT AND LOCATED OUT OF THE DISPLAY SUB-REGION

CROSS-REFERENCES TO RELATED APPLICATIONS

This application is a continuation of International Application No. PCT/CN2022/127920, filed on Oct. 27, 2022, and claims priority to Chinese Patent Application No. 202211094965.2, filed on Sep. 5, 2022, the content of which is incorporated herein by reference in its entirety.

TECHNICAL FIELD

The present disclosure relates to the field of display technologies, and in particular, to a display panel and a display apparatus.

BACKGROUND

With increasingly high requirements on a screen-to-body ratio of electronic devices, a full screen has become a major development trend of mobile terminals. To realize the full screen, it is important to provide such photosensitive elements as a camera under a display screen. While realizing a display function, the display screen can further ensure normal effects of the photosensitive elements. However, when the photosensitive elements is provided under the screen, it may cause a poor display uniformity of the display screen.

SUMMARY

A first aspect of the present disclosure provides a display panel. The display panel includes a display region. The display region includes a first display region and at least one second display region that are arranged along a first direction. The first display region includes a first display sub-region and at least one second display sub-region that are arranged along a second direction. The second display sub-region is provided with a photosensitive element. The display region includes sub-pixels distributed in an array. The sub-pixels include first sub-pixels located in the first display sub-region, second sub-pixels located in the second display sub-region, and third sub-pixels located in the at least one second display region. The display region further includes driving units; the driving units include first driving units, second driving units, and third driving units; and the third driving units are located in the at least one second display region and are electrically connected to the third sub-pixels in one-to-one correspondence, so as to drive the third sub-pixels to emit light. The first driving units and the second driving units are located in the first display sub-region; the first driving units are electrically connected to the first sub-pixels in one-to-one correspondence, so as to drive the first sub-pixels to emit light; and the second driving units are electrically connected to the second sub-pixels in one-to-one correspondence, so as to drive the second sub-pixels to emit light. In the first display region, an orthographic projection of any one of the driving units on a light exit surface of the display panel has an area $S1$, and in the second display region, an orthographic projection of any one of the driving units on the light exit surface of the display panel has an area $S2$, where $½<S1:S2≤1$. The first direction intersects with the second direction.

A second aspect of the present disclosure provides a display apparatus. The display apparatus includes a display panel. The display panel includes a display region. The display region includes a first display region and at least one second display region that are arranged along a first direction. The first display region includes a first display sub-region and at least one second display sub-region that are arranged along a second direction. The second display sub-region is provided with a photosensitive element. The display region includes sub-pixels distributed in an array. The sub-pixels include first sub-pixels located in the first display sub-region, second sub-pixels located in the second display sub-region, and third sub-pixels located in the at least one second display region. The display region further includes driving units; the driving units include first driving units, second driving units, and third driving units; and the third driving units are located in the at least one second display region and are electrically connected to the third sub-pixels in one-to-one correspondence, so as to drive the third sub-pixels to emit light. The first driving units and the second driving units are located in the first display sub-region; the first driving units are electrically connected to the first sub-pixels in one-to-one correspondence, so as to drive the first sub-pixels to emit light; and the second driving units are electrically connected to the second sub-pixels in one-to-one correspondence, so as to drive the second sub-pixels to emit light. In the first display region, an orthographic projection of any one of the driving units on a light exit surface of the display panel has an area $S1$, and in the second display region, an orthographic projection of any one of the driving units on the light exit surface of the display panel has an area $S2$, where $½<S1:S2≤1$. The first direction intersects with the second direction.

BRIEF DESCRIPTION OF DRAWINGS

The accompanying drawings, which are incorporated in and constitute a part of the specification, illustrate embodiments of the present disclosure and together with the general description, serve to explain the principles of the present disclosure.

DESCRIPTION OF EMBODIMENTS

Figure 1:
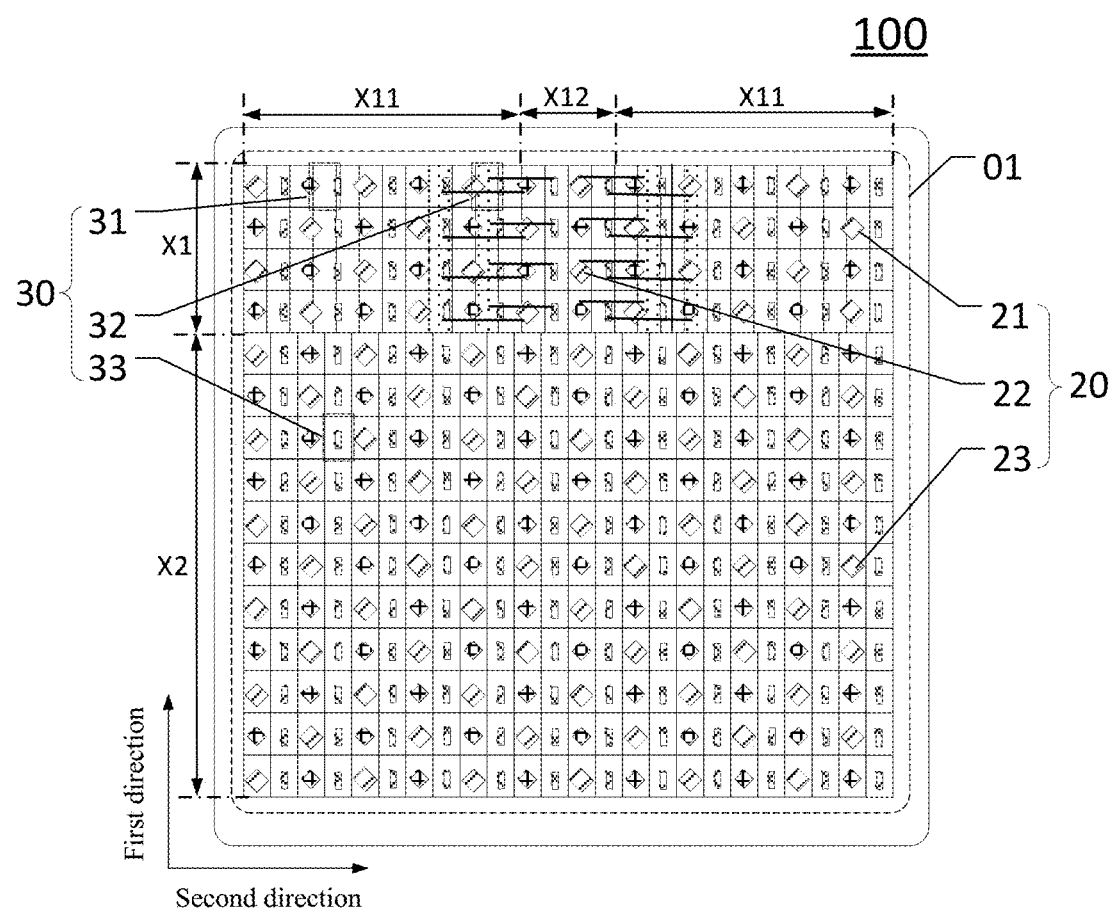
FIG. 1 is a schematic view of a display panel according to an embodiment of the present disclosure.

Exemplary embodiments of the present disclosure are described in detail below with reference to the accompanying drawings. It should be noted that unless otherwise specified, the relative arrangement, numerical expressions, and numerical values of components and steps set forth in these embodiments do not limit the scope of the present disclosure.

The following description of at least one exemplary embodiment is merely illustrative, and not intended to limit the present disclosure and application or use thereof in any way.

The technologies, methods, and devices known to those of ordinary skill in the art may not be discussed in detail, but where appropriate, the technologies, methods, and devices should be regarded as part of the specification.

In all examples shown and discussed herein, any specific value should be interpreted as merely exemplary, rather than restrictive. Therefore, other examples of the exemplary embodiments may have different values.

It should be noted that similar reference signs and letters represent similar items in the drawings below. Therefore, once an item is defined in one drawing, it does not need to be further discussed in subsequent drawings.

With increasingly high requirements on a screen-to-body ratio of electronic devices, a full screen has become a major development trend of mobile terminals in the prior art. To realize the full screen, it is important to provide such photosensitive elements as a camera under a display screen. While realizing a display function, the display screen can further ensure normal effects of the photosensitive elements. However, the under-screen photosensitive elements may cause a poor display uniformity of the display screen.

In view of this, the present disclosure provides a display panel and a display apparatus, to improve display effect of the display panel including an under-screen photosensitive element.

FIG. 1 is a schematic view of a display panel according to an embodiment of the present disclosure. Referring to FIG. 1, the present disclosure provides a display apparatus 100, including a display region 10.

The display region 10 includes a first display region X1 and at least one second display region X2 along a first direction. The first display region X1 includes a first display sub-region X11 and at least one second display sub-region X12 along a second direction. The second display sub-region X12 is provided with a photosensitive element.

The display region 10 includes multiple sub-pixels 20 distributed in an array. The sub-pixels 20 include first sub-pixels 21, second sub-pixels 22, and third sub-pixels 23. The first sub-pixels 21 are located in the first display sub-region X11. The second sub-pixels 22 are located in the second display sub-region X12. The third sub-pixels 23 are located in the second display region X2.

The display region 10 further includes driving units 30. The driving units 30 include first driving units 31, second driving units 32, and third driving units 33. The third driving units 33 are located in the second display region X2, and are electrically connected to the third sub-pixels 23 in one-to-one correspondence, so as to drive the third sub-pixels 23 to emit light.

The first driving units 31 and the second driving units 32 are located in the first display sub-region X11. The first driving units 31 are electrically connected to the first sub-pixels 21 in one-to-one correspondence, so as to drive the first sub-pixels 21 to emit light. The second driving units 32 are electrically connected to the second sub-pixels 22 in one-to-one correspondence, so as to drive the second sub-pixels 22 to emit light.

In the first display region X1, orthographic projection of any one of the driving units 30 on a light exit surface of the display panel 100 has an area of S1. In the second display region X2, orthographic projection of any one of the driving units 30 on the light exit surface of the display panel 100 has an area of S2, $\frac{1}{2}<S1:S2\leq 1$.

The first direction intersects with the second direction.

The present disclosure provides a display panel 100. The display panel 100 includes a display region 10. In an optional embodiment of the present disclosure, along a first direction, the display region 10 includes a first display region X1 and a second display region X2 that are adjacent to each other. The first display region X1 includes a first display sub-region X11, a second display sub-region X12, and the display sub-region X11 sequentially arranged along a second direction. The second display sub-region X12 is configured to provide a photosensitive element. For example, the photosensitive element may be a camera. A specific type of the photosensitive element is not defined in the present disclosure.

The display region 10 includes multiple sub-pixels 20 distributed in an array. According to different positions of the sub-pixels 20 in the display region 10, the sub-pixels 20 in the display region 10 are divided into three types, namely first sub-pixels 21, second sub-pixels 22, and third sub-pixels 23. The sub-pixels 20 in the first display sub-region X11 are the first sub-pixels 21, the sub-pixels 20 in the second display sub-region X12 are the second sub-pixels 22, and the sub-pixels 20 in the second display region X2 are the third sub-pixels 23. It is to be noted that according to display requirements, the first sub-pixels 21 may correspondingly include a red sub-pixel, a blue sub-pixel, a green sub-pixel and the like, the second sub-pixels 22 may correspondingly include a red sub-pixel, a blue sub-pixel, a green sub-pixel and the like, and the third sub-pixels 23 may correspondingly include a red sub-pixel, a blue sub-pixel, a green sub-pixel and the like. Types of colors for the sub-pixels 20 are not defined in the present disclosure, and can be adjusted correspondingly according to design requirements of the display panel 100. Different fill patterns in FIG. 1 can represent colors of the pixels. For example, square blocks having a larger size and filled with a slash are the blue sub-pixels, square blocks having a smaller size and filled with a square lattice are the red sub-pixels, and rectangular blocks having a minimum size and filled with a grid are the green sub-pixels. This is merely an optional embodiment of the present disclosure. Sizes and arrangement rules for various colors of the sub-pixels in the display panel are not defined in the present disclosure, and can be adjusted correspondingly according to actual requirements.

It is to be noted that the first sub-pixels 21, the second sub-pixels 22 and the third sub-pixels 23 in the display panel 100 are formed into multiple uniform and regular sub-pixels 20 in the whole display region 10. This prevents different arrangement densities of the sub-pixels 20, and ensures a uniform display effect of the display panel 100. That is, the arrangement structure of the sub-pixels 20 is not adjusted with positions of the driving units corresponding to the sub-pixels in the first display region X1.

Concerning the driving units 30 for driving the sub-pixels 20 in the display region 10, in an embodiment of the present disclosure, the first driving units 31 in the driving units 30 are electrically connected to the first sub-pixels 21 in the display region 10 in one-to-one correspondence. Through the first driving units 31 for driving the electrically connected first sub-pixels 21, the first sub-pixels 21 emit light or are extinguished. The second driving units 32 in the driving units 30 are electrically connected to the second sub-pixels 22 in the display region 10 in one-to-one correspondence. Through the second driving units 32 for driving the electrically connected second sub-pixels 22, the second sub-pixels 22 emit light or are extinguished. The third driving units 33 in the driving units 30 are electrically connected to the third sub-pixels 23 in the display region 10 in one-to-one correspondence. Through the third driving units 33 for driving the electrically connected third sub-pixels 23, the third sub-pixels 23 emit light or are extinguished. In the present disclosure, the third driving units 33 are provided in the second display region X2, while the first driving units 31 and the second driving units 32 are provided in the first display sub-region X11. That is, the driving units 30 are not provided in the second display sub-region X12 for providing the photosensitive element. The second driving units 32 electrically connected to the second sub-pixels 22 in the second display sub-region X12 are provided outside the second display sub-region X12, so a space of the second display sub-region X12 is unnecessarily occupied. This can prevent a condition in which only one driving unit 30 can be provided for multiple second sub-pixels 22 due to an inadequate space, can prevent the driving units 30 from occupying a space of the photosensitive element, and can further realize one-to-one driving design of the second sub-pixels 22. Therefore, the resolution of the second display sub-region X12 is improved, the second display sub-region X12 has a same resolution as the remaining display region 10, the display effect in each region of the display region 10 is more uniform, and the display effect of the display panel 100 is optimized.

In addition, since the first driving units 31 and the second driving units 32 are provided in the first display sub-region X11, compared with a condition in which only the first driving units are correspondingly provided in the first display sub-region in the prior art, a space occupied by at least one of the first driving units 31 is to be compressed. Therefore, in an embodiment of the present disclosure, in the first display region X1, orthographic projection of any one of the driving units 30 on a light exit surface of the display panel 100 has an area of S1. In the second display region X2, orthographic projection of any one of the driving units 30 on the light exit surface of the display panel 100 has an area of S2, $\frac{1}{2}<S1:S2\leq1$. That is, the driving unit 30 in the first display region X1 has a smaller size than the driving unit 30 in the second display region X2, or the driving unit 30 in the first display region X1 has a same size as the driving unit 30 in the second display region X2 (shown in the following embodiment). For fear of difficult arrangement of the driving units 30 and complex arrangement of related traces, in an embodiment of the present disclosure, when the driving unit 30 in the first display region X1 has the smaller size than the driving unit 30 in the second display region X2, $\frac{1}{2}<S1:S2$. This prevents excessive inclination of traces passing through the first display region X1 and the second display region X2 in extension, and ensures conciseness of traces in the display panel 100.

In addition, according to the display panel 100 provided by the present disclosure, without changing light-emitting positions of the sub-pixels 20 and the number of the sub-pixels in the display panel 100, the second driving units 32 are provided outside the second display sub-region X12, and the second driving units 32 are configured to drive the sub-pixels 20 in the second display sub-region X12 in one-to-one correspondence. This ensures stable and uniform display of the display panel 100.

It is further to be noted that the number of the first display regions X1 and the number of the second display regions X2 in the display region 10 are not defined in the present disclosure. For example, along the first direction, two sides of the first display region X1 each are provided with the second display region X2, or multiple first display regions X1 and multiple second display regions X2 are provided alternately. In addition, the number of the first display sub-regions X11 and the number of the second display sub-regions X12 in the first display region X1 are also not defined in the present disclosure. For example, along the second direction, there may be only one first display sub-region X11 and one second display sub-region X12 that are adjacent to each other, or there may also be multiple first display sub-regions X11 and multiple second display sub-regions X12 that are provided alternately.

Figure 2:
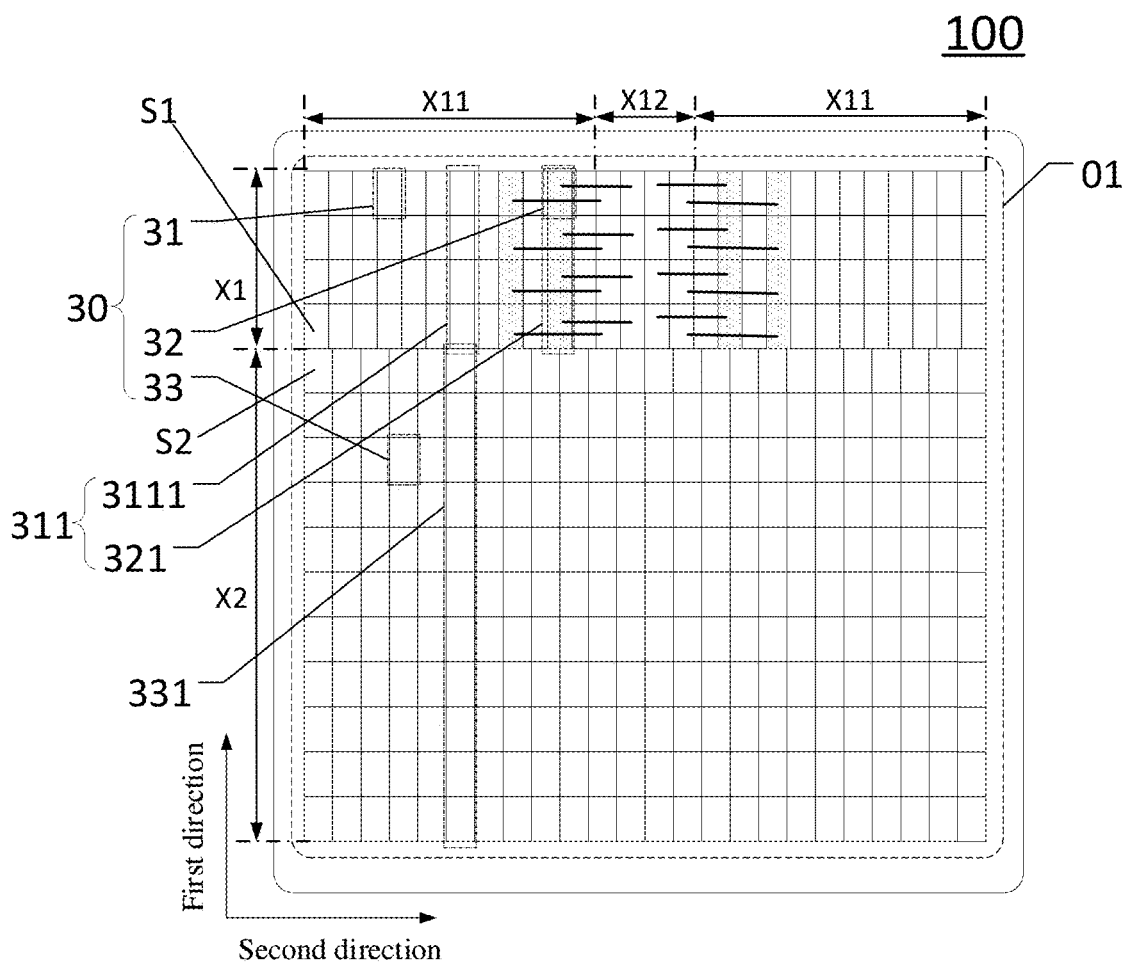
FIG. 2 is a schematic view of a display panel according to an embodiment of the present disclosure.

FIG. 2 is a schematic view of a display panel according to an embodiment of the present disclosure. Referring to FIG. 1 and FIG. 2, it is to be noted that for the clarity of relevant arrangement of the driving units in the display panel, the sub-pixels are not shown in FIG. 2. Optionally, the first display region X1 includes multiple first driving unit columns 311 extending along the first direction, and arranged along the second direction.

The second display region X2 includes multiple second driving unit columns 331 extending along the first direction, and arranged along the second direction.

When S1:S2<1, along the first direction, for a same column of the sub-pixels 20, a corresponding one of the first driving unit columns 311 and a corresponding one of the second driving unit columns 331 at least partially overlap.

In an embodiment of the present disclosure, the first display region X1 includes multiple first driving unit columns 311. The plurality of first driving unit columns 311 extend along the first direction, and are arranged along the second direction. The second display region X2 includes multiple second driving unit columns 331. The plurality of second driving unit columns 331 extend along the first direction, and are arranged along the second direction. According to the display panel 100 provided by the present disclosure, in the first display region X1, the orthographic projection of the driving unit 30 on the light exit surface of the display panel 100 has an area S1. In the second display region X2, the orthographic projection of the driving unit 30 on the light exit surface of the display panel 100 has an area S2. In an embodiment of the present disclosure, S1:S2<1. In this case, along the first direction, for a same column of the sub-pixels 20, a corresponding one of the first driving unit columns 311 and a corresponding one of the second driving unit columns 331 do not have a same size, but at least partially overlap. As such, if adjacent first driving unit column 311 and second driving unit column 331 overlap, when traces extending along the first direction are to be provided to realize electrical connection of each driving unit 30 in the adjacent first driving unit column 311 and second driving unit column 331, the traces can be nearly straight without excessive deviation. This simplifies manufacture of related structures, and ensures conciseness of traces in the display panel 100. Meanwhile, the area and size of each driving unit 30 in the second display region X2 are adjusted unnecessarily, and the existing manufacture can be reused to make the second display region X2. Compared with the second display region X2, only the size of each driving unit 30 in the first display region X1 is to be adjusted.

It is further to be noted that $½<S1:S2≤1$ and $½<S1:S2<1$ are merely optional embodiments of the present disclosure, and may be a relatively wide range for S1:S2 in the present disclosure. In addition, there may also be $⅔<S1:S2<⅘$, $¾<S1:S2<9/10$, and the like, provided that for a same column of the sub-pixels 20 extending along the first direction, a corresponding one of the first driving unit columns 311 and a corresponding one of the second driving unit columns 331 overlap, thereby reducing the number of inclination portions of traces electrically connected to the driving units 30 in the first driving unit column 311 and the second driving unit column 331, and simplifying manufacture of related structure.

Figure 3:
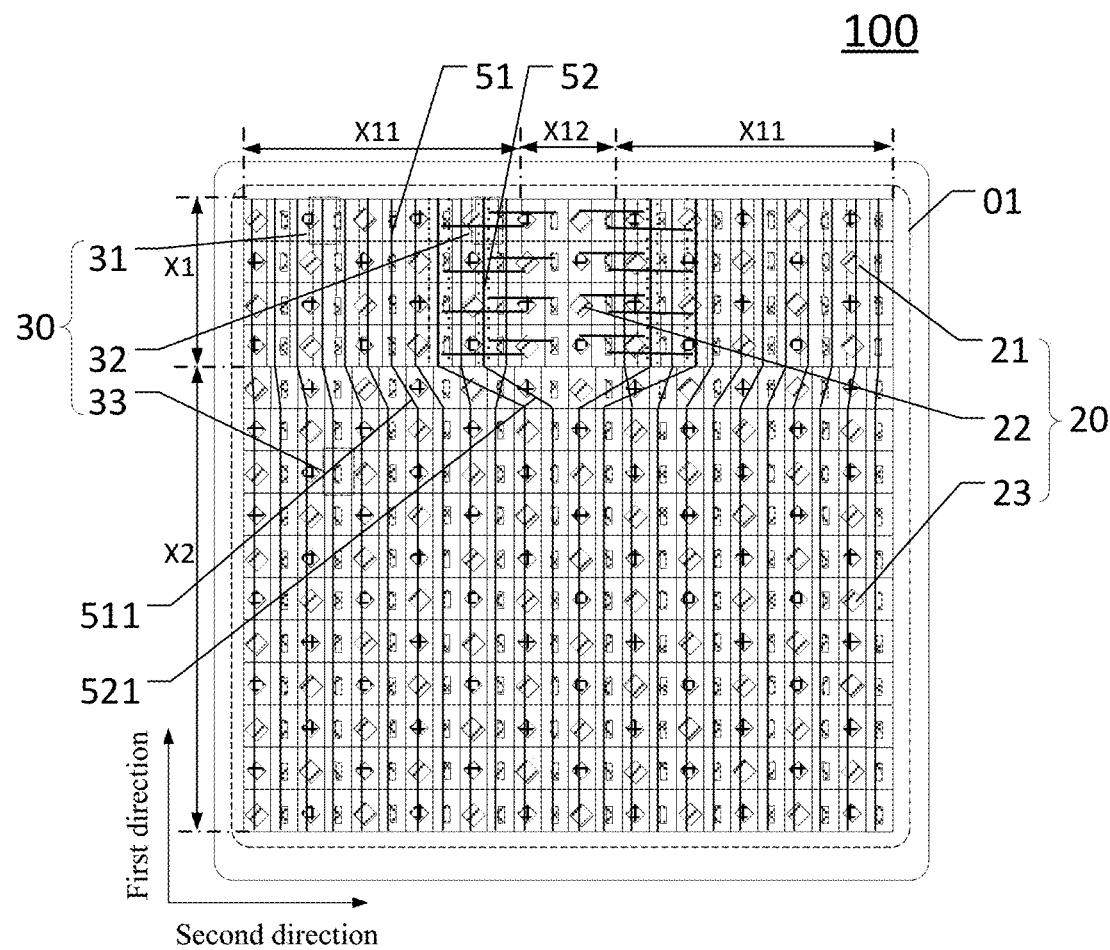
FIG. 3 is a schematic view of a display panel according to an embodiment of the present disclosure.
Figure 4:
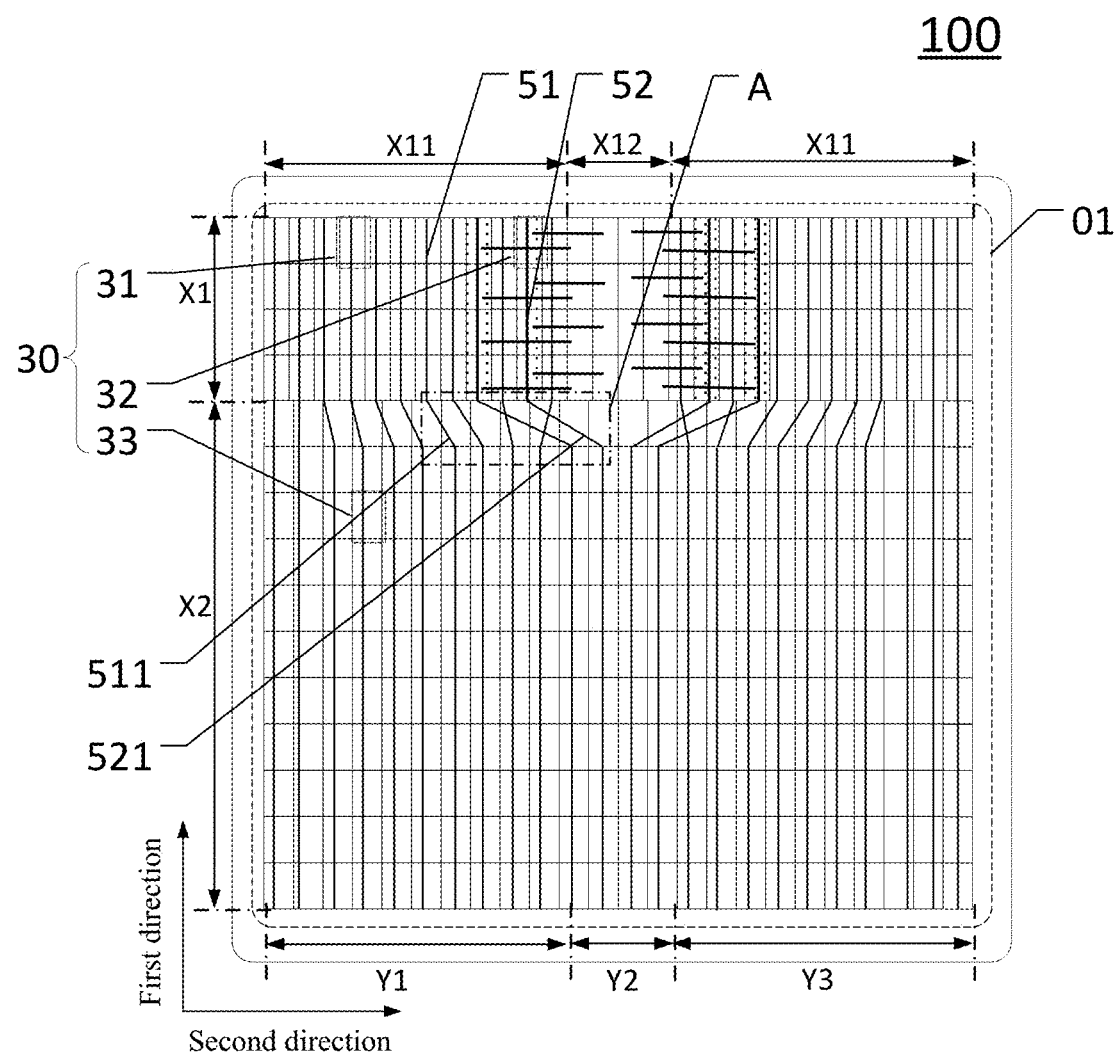
FIG. 4 is a schematic view of a display panel according to an embodiment of the present disclosure.

FIG. 3 is a schematic view of a display panel according to an embodiment of the present disclosure. FIG. 4 is a schematic view of a display panel according to an embodiment of the present disclosure. Referring to FIG. 2 to FIG. 4, it is to be noted that for the clarity of relevant arrangement of the driving units in the display panel, the sub-pixels are not shown in FIG. 4. Optionally, the display region 10 includes multiple first data lines 51 and multiple second data lines 52 extending along the first direction. The first data lines 51 are respectively electrically connected to the third sub-pixels 23 and the first sub-pixels 21. The second data lines 52 are respectively electrically connected to the third sub-pixels 23 and the second sub-pixels 22.

When S1:S2<1, at least one of the first data lines 51 includes a first inclination portion 511. An extension direction of the first inclination portion 511 intersects with the first direction. The second data lines 52 each include a second inclination portion 521. An extension direction of the second inclination portion 521 intersects with the first direction.

The first inclination portion 511 has a length of L1 along the extension direction, and the second inclination portion 521 has a length of L2 along the extension direction, L1<L2.

In an embodiment of the present disclosure, the display region 10 includes multiple first data lines 51 and multiple second data lines 52 extending along the first direction. Through the first data lines 51, each column of the third sub-pixels 23 and each column of the first sub-pixels 21 that extend along the first direction are electrically connected. Through the second data lines 52, each column of the third sub-pixels 23 and each column of the second sub-pixels 22 that extend along the first direction are electrically connected. Orientations of data lines 50 in the display region 10 depend on orientations of the driving units 30. According to the display panel 100 provided by the present disclosure, in the first display region X1, the orthographic projection of the driving unit 30 on the light exit surface of the display panel 100 has an area S1. In the second display region X2, the orthographic projection of the driving unit 30 on the light exit surface of the display panel 100 has an area S2. In an embodiment of the present disclosure, S1:S2<1. In this case, as shown in FIG. 3 and FIG. 4, at least one of the first data lines 51 includes a first inclination portion 511 located at a side of the second display region X2 close to the first display region X1, and the second data lines 52 each include a second inclination portion 521 located at the side of the second display region X2 close to the first display region X1. An extension direction of the first inclination portion 511 and an extension direction of the second inclination portion 521 intersect with the first direction. When two sides of the second display sub-region X12 in the first display region X1 each include the first display sub-region X11, at least two first inclination portions 511 have different extension directions (for example, a ninth first inclination portion 511 and a tenth first inclination portion 511 from left to right in FIG. 3), and at least two second inclination portions 521 have different extension directions (for example, a second inclination portion 521 and a third second inclination portion 521 from left to right in FIG. 3). This facilitates the electrical connections of the first data line 51 and the second data line 52 with the corresponding driving unit 30 better, and ensures conciseness of traces in the display region 10. In an embodiment of the present disclosure, a length of the first inclination portion 511 is less than a length of the second inclination portion 521. This prevents excessive inclination of the first inclination portion 511, ensures that more first data lines 51 are nearly straight in the first direction, and simplifies manufacture of related structures.

Figure 5:
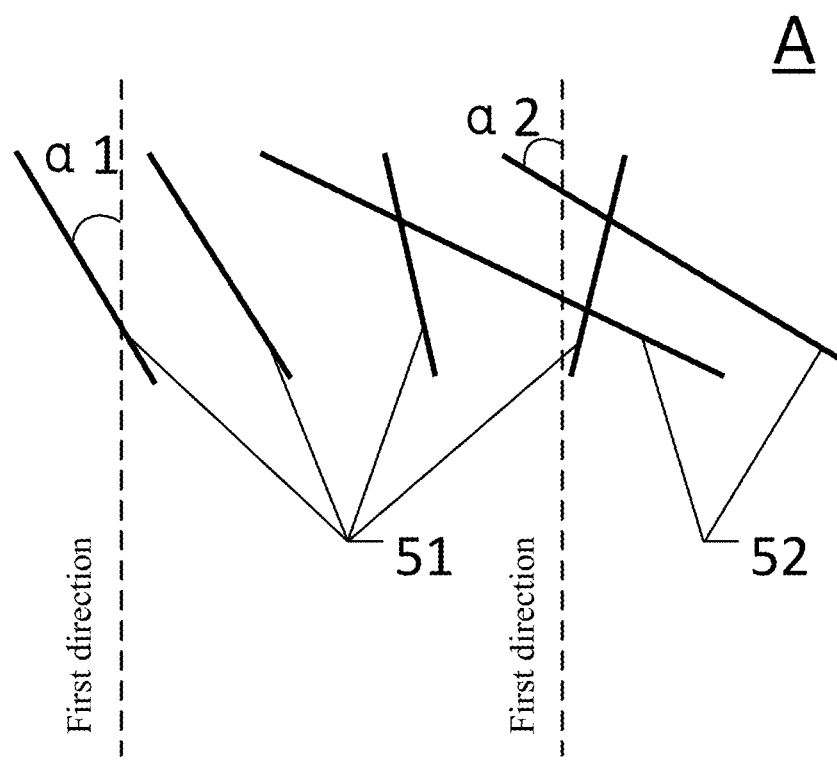
FIG. 5 is a partially enlarged view of a region A shown in FIG. 4 according to an embodiment of the present disclosure.

FIG. 5 is a partially enlarged view of a region A shown in FIG. 4 according to an embodiment of the present disclosure. Referring also to FIG. 2 to FIG. 5, optionally, the display region 10 includes multiple first data lines 51 and multiple second data lines 52 extending along the first direction. The first data lines 51 are respectively electrically connected to the third sub-pixels 23 and the first sub-pixels 21. The second data lines 52 are respectively electrically connected to the third sub-pixels 23 and the second sub-pixels 22.

When S1:S2<1, at least one of the first data lines 51 includes a first inclination portion 511. An extension direction of the first inclination portion 511 intersects with the first direction. The second data lines 52 each include a second inclination portion 521. An extension direction of the second inclination portion 521 intersects with the first direction.

The first inclination portion 511 has an inclination angle of α1 relative to the first direction, and the second inclination portion 521 has an inclination angle of α2 relative to the first direction, α1<α2.

In an embodiment of the present disclosure, the display region 10 includes multiple first data lines 51 and multiple second data lines 52 extending along the first direction. Through the first data lines 51, each column of the third sub-pixels 23 and each column of the first sub-pixels 21 that extend along the first direction are electrically connected. Through the second data lines 52, each column of the third sub-pixels 23 and each column of the second sub-pixels 22 that extend along the first direction are electrically connected. Orientations of data lines 50 in the display region 01 depend on orientations of the driving units 30. According to the display panel 100 provided by the present disclosure, in the first display region X1, the orthographic projection of the driving unit 30 on the light exit surface of the display panel 100 has an area S1. In the second display region X2, the orthographic projection of the driving unit 30 on the light exit surface of the display panel 100 has an area S2. In an embodiment of the present disclosure, S1:S2<1. In this case, as shown in FIG. 3 to FIG. 5, at least one of the first data lines 51 includes a first inclination portion 511 located at a side of the second display region X2 close to the first display region X1, and the second data lines 52 each include a second inclination portion 521 located at the side of the second display region X2 close to the first display region X1. An extension direction of the first inclination portion 511 and an extension direction of the second inclination portion 521 intersect with the first direction. When two sides of the second display sub-region X12 in the first display region X1 each include the first display sub-region X11, at least two first inclination portions 511 have different extension directions, and at least two second inclination portions 521 have different extension directions. This facilitates the electrical connections of the first data line 51 and the second data line 52 with the corresponding driving unit 30 better, and ensures conciseness of traces in the display region 10. In an embodiment of the present disclosure, an inclination angle of the first inclination portion 511 relative to the first direction is less than an inclination angle of the second inclination portion 521 relative to the first direction. This prevents excessive inclination of the first inclination portion 511, ensures that more first data lines 51 are nearly straight in the first direction, and simplifies manufacture of related structures.

Referring also to FIG. 2 to FIG. 4, optionally, the display region 10 includes multiple first data lines 51 and multiple second data lines 52 extending along the first direction. The first data lines 51 are respectively electrically connected to the third sub-pixels 23 and the first sub-pixels 21. The second data lines 52 are respectively electrically connected to the third sub-pixels 23 and the second sub-pixels 22.

When S1:S2<1, at least one of the first data lines 51 includes a first inclination portion 511. An extension direction of the first inclination portion 511 intersects with the first direction. The second data lines 52 each include a second inclination portion 521. An extension direction of the second inclination portion 521 intersects with the first direction.

In a direction toward the first display sub-region X11 along the second display sub-region X12, an inclination direction of the first inclination portion 511 includes the direction toward the first display sub-region X11 along the second display sub-region X12. The inclination direction of the first inclination portion 511 further includes a direction toward the second display sub-region X12 along the first display sub-region X11.

In an embodiment of the present disclosure, the display region 10 includes multiple first data lines 51 and multiple second data lines 52 extending along the first direction. Through the first data lines 51, each column of the third sub-pixels 23 and each column of the first sub-pixels 21 that extend along the first direction are electrically connected. Through the second data lines 52, each column of the third sub-pixels 23 and each column of the second sub-pixels 22 that extend along the first direction are electrically connected. Orientations of data lines 50 in the display region 01 depend on orientations of the driving units 30. According to the display panel 100 provided by the present disclosure, in the first display region X1, the orthographic projection of the driving unit 30 on the light exit surface of the display panel 100 has an area S1. In the second display region X2, the orthographic projection of the driving unit 30 on the light exit surface of the display panel 100 has an area S2. In an embodiment of the present disclosure, S1:S2<1. In this case, as shown in FIG. 3 to FIG. 5, at least one of the first data lines 51 includes a first inclination portion 511 located at a side of the second display region X2 close to the first display region X1, and the second data lines 52 each include a second inclination portion 521 located at the side of the second display region X2 close to the first display region X1. An extension direction of the first inclination portion 511 and an extension direction of the second inclination portion 521 intersect with the first direction.

In an optional embodiment of the present disclosure, as shown in FIG. 3 and FIG. 4, an inclination direction of the first inclination portion 511 includes two inclination directions in a direction from the second display sub-region X12 to the first display sub-region X11 at one side. Left three first inclination portions 511 in FIG. 4 are inclined toward the first display sub-region X11 along the second display sub-region X12, and the rightmost first inclination portion 511 in FIG. 4 is inclined toward the second display sub-region X12 along the first display sub-region X11.

Therefore, the column of the second sub-pixels 22 in the second display sub-region X12 electrically connected to the second data lines 52 is corresponding to the column of the third sub-pixels 23 in the second display region X2, more first data lines 51 electrically connected to the first sub-pixels 21 and the third sub-pixels 23 are straight or nearly straight, and manufacture of related structures in the display panel 100 is simplified.

Referring to FIG. 2 to FIG. 5, optionally, the display region 10 includes multiple first data lines 51 and multiple second data lines 52 extending along the first direction. The first data lines 51 are respectively electrically connected to the third sub-pixels 23 and the first sub-pixels 21. The second data lines 52 are respectively electrically connected to the third sub-pixels 23 and the second sub-pixels 22.

When S1:S2<1, at least one of the first data lines 51 includes a first inclination portion 511. An extension direction of the first inclination portion 511 intersects with the first direction. The second data lines 52 each include a second inclination portion 521. An extension direction of the second inclination portion 521 intersects with the first direction.

At least one of the first data lines 51 is a straight line.

In an embodiment of the present disclosure, the display region 10 includes multiple first data lines 51 and multiple second data lines 52 extending along the first direction. Through the first data lines 51, each column of the third sub-pixels 23 and each column of the first sub-pixels 21 that extend along the first direction are electrically connected. Through the second data lines 52, each column of the third sub-pixels 23 and each column of the second sub-pixels 22 that extend along the first direction are electrically connected. Orientations of data lines 50 in the display region 01 depend on orientations of the driving units 30. According to the display panel 100 provided by the present disclosure, in the first display region X1, the orthographic projection of the driving unit 30 on the light exit surface of the display panel 100 has an area S1. In the second display region X2, the orthographic projection of the driving unit 30 on the light exit surface of the display panel 100 has an area S2. In an embodiment of the present disclosure, S1:S2<1. In this case, as shown in FIG. 3 to FIG. 5, at least one of the first data lines 51 includes a first inclination portion 511 located at a side of the second display region X2 close to the first display region X1, and the second data lines 52 each include a second inclination portion 521 located at the side of the second display region X2 close to the first display region X1. An extension direction of the first inclination portion 511 and an extension direction of the second inclination portion 521 intersect with the first direction.

In an optional embodiment of the present disclosure, as shown in FIG. 4, at least one of the first data lines 51 is a straight line extending along the first direction. In this way, the first driving unit 31 and the third driving unit 33 corresponding to the first sub-pixel 21 and the third sub-pixel 23 in a column of the sub-pixels 20 along the first direction can be electrically connected through the first data line 51, the first driving unit 31, the third driving unit 33 and the first data line 51 corresponding to the column are manufactured regularly and conveniently, manufacture of related structures in the display panel 100 is simplified, and conciseness of traces in the display panel 100 is ensured.

Referring to FIG. 2 to FIG. 4, optionally, the display region 10 includes a first region Y1, a second region Y2, and a third region Y3 sequentially arranged along the second direction. The second region Y2 is located between the first region Y1 and the third region Y3. At least one of the first data lines 51 in the first region Y1 is a straight line, and/or, at least one of the first data lines 51 in the third region Y3 is a straight line.

In an optional embodiment of the present disclosure, the display region 10 includes a first region Y1, a second region Y2, and a third region Y3 sequentially arranged along the second direction. The first data lines 51 extending along the first direction and in a form of the straight line are located in the first region Y1, or in the third region Y3, or in the first region Y1 and the third region Y3 (as shown in FIG. 4). That is, the first data lines 51 in the form of the straight line are provided close to an edge of the display region 10 along the second direction of the display region 10.

At least one of the first data lines 51 is a straight line extending along the first direction. In this way, the first driving unit 31 and the third driving unit 33 corresponding to the first sub-pixel 21 and the third sub-pixel 23 in a column of the sub-pixels 20 along the first direction can be electrically connected through the first data line 51, the first driving unit 31, the third driving unit 33 and the first data line 51 corresponding to the column are manufactured regularly and conveniently, manufacture of related structures in the display panel 100 is simplified, and conciseness of traces in the display panel 100 is ensured.

When the data lines close to the edge of the display region 10 are the straight lines, remaining data lines close to a center of the display region 10 do not cause a large offset. That is, inclination portions of the remaining data lines are not inclined excessively. Therefore, the overall manufacturing process of the display panel 100 is simpler.

Figure 6:
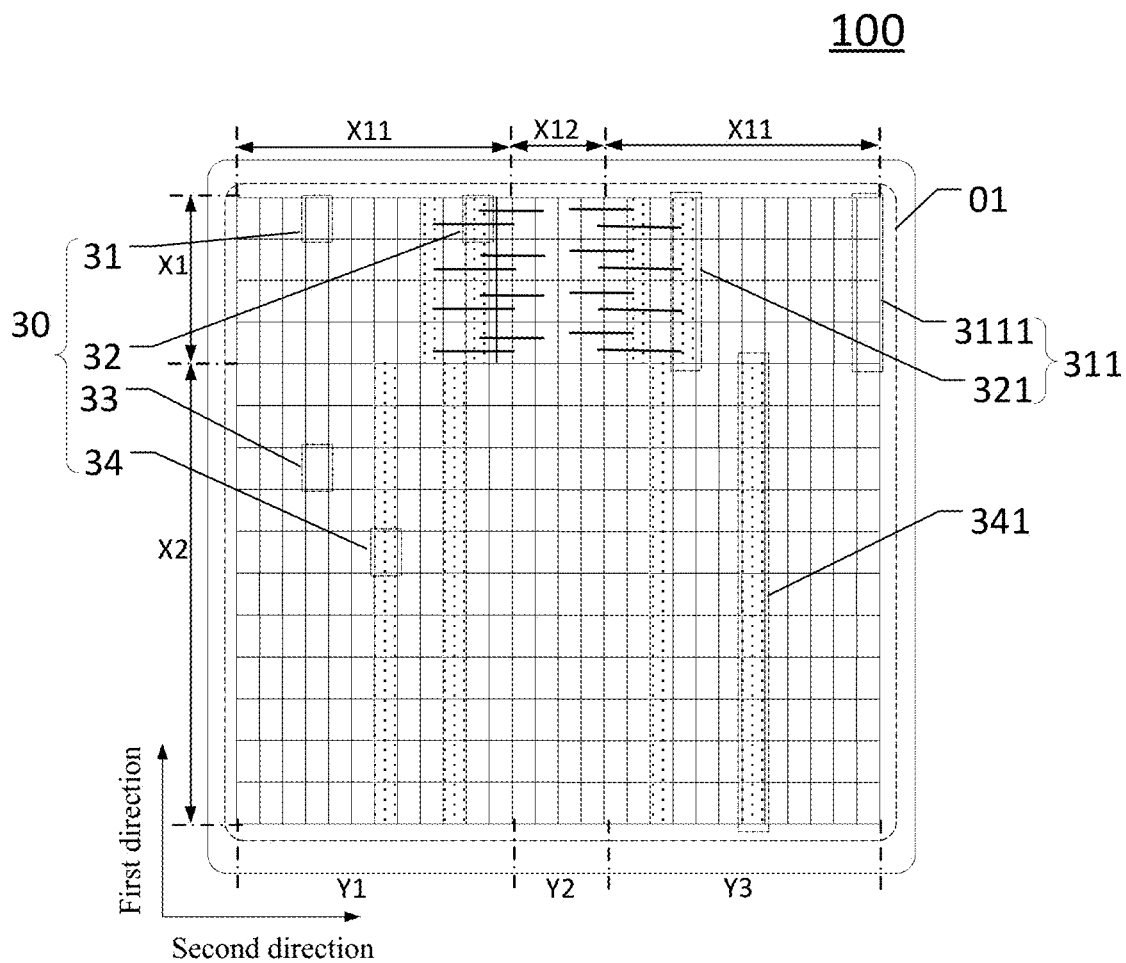
FIG. 6 is a schematic view of a display panel according to an embodiment of the present disclosure.

FIG. 6 is a schematic view of a display panel according to an embodiment of the present disclosure. Referring to FIG. 6, it is to be noted that for the clarity of relevant arrangement of the driving units in the display panel, the sub-pixels are not shown in FIG. 6. Optionally, when S1:S2=1, the second display region X2 includes dummy driving units 34. The dummy driving units 34 are formed into dummy driving unit columns 341 along the first direction. The number of the dummy driving unit columns 341 is the same as the number of second sub-first driving unit columns 321 formed by the second driving units 32.

According to the display panel 100 provided by the present disclosure, in the first display region X1, the orthographic projection of the driving unit 30 on the light exit surface of the display panel 100 has an area S1. In the second display region X2, the orthographic projection of the driving unit 30 on the light exit surface of the display panel 100 has an area S2. In an embodiment of the present disclosure, S1:S2=1. For the sake of S1:S2=1, dummy driving units 34 may be provided in the second display region X2. The dummy driving units 34 are formed into dummy driving unit columns 341 along the first direction. The number of the dummy driving unit columns 341 is the same as the number of second sub-first driving unit columns 321. That is, the number of the second sub-first driving unit columns 321 in the first display region X1 is the same as the number of the dummy driving unit columns 341 in the second display region X2. Therefore, the first display region X1 and the second display region X2 in the display panel 100 have a same number of driving unit columns formed by the driving units 30.

With the above structure, the driving units 30 and the data lines in each driving unit column are manufactured regularly. The data lines can extend straightly. This simplifies manufacture of related structures in the display panel 100, and ensures conciseness of traces in the display panel 100. The regularly manufactured driving units 30 and the regularly manufactured data lines have a same size. This can ensure that the whole display region 10 has a same reflectivity, and improves display uniformity of the display panel 100.

Figure 7:
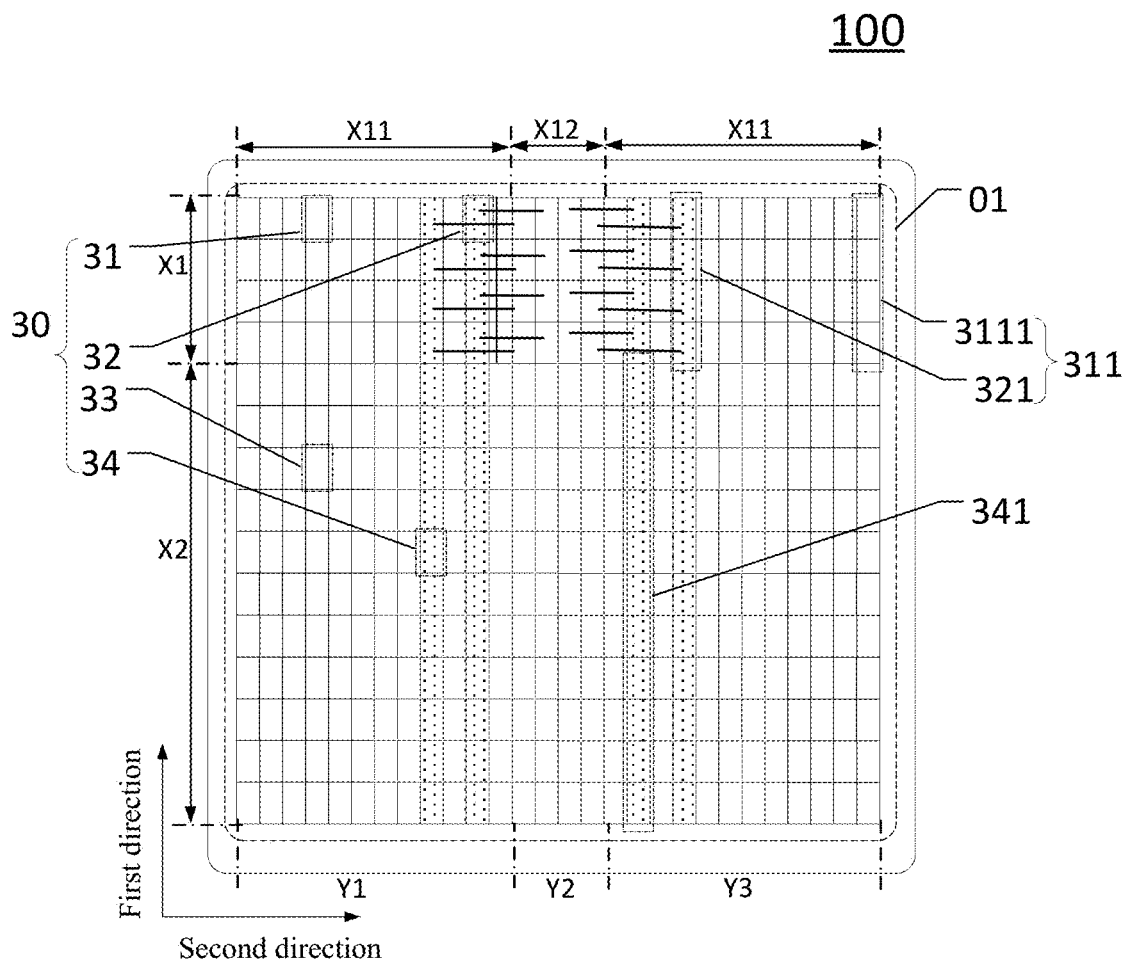
FIG. 7 is a schematic view of a display panel according to an embodiment of the present disclosure.
Figure 8:
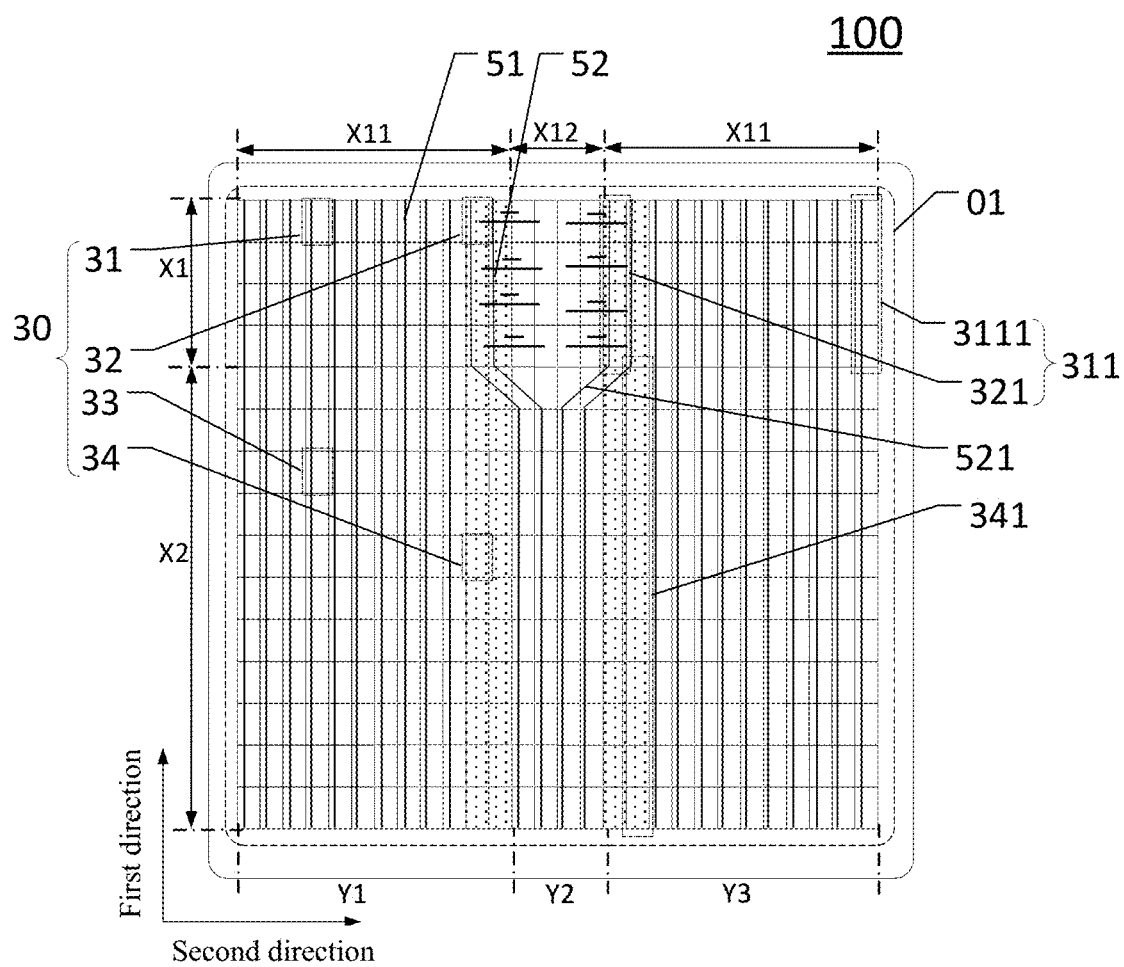
FIG. 8 is a schematic view of a display panel according to an embodiment of the present disclosure.

FIG. 7 is a schematic view of a display panel according to an embodiment of the present disclosure. FIG. 8 is a schematic view of a display panel according to an embodiment of the present disclosure. Referring to FIG. 7 and FIG. 8, it is to be noted that for the clarity of relevant arrangement of the driving units in the display panel, the sub-pixels are not shown in FIG. 7 and FIG. 8. Optionally, when S1:S2=1, the second display region X2 includes dummy driving units 34. The dummy driving units 34 are formed into dummy driving unit columns 341 along the first direction. The number of the dummy driving unit columns 341 is the same as the number of second sub-first driving unit columns 321 formed by the second driving units 32. Any one of the dummy driving unit columns 341 and a corresponding one of the second sub-first driving unit columns 321 are arranged in a same column along the first direction.

According to the display panel 100 provided by the present disclosure, in the first display region X1, the orthographic projection of the driving unit 30 on the light exit surface of the display panel 100 has an area S1. In the second display region X2, the orthographic projection of the driving unit 30 on the light exit surface of the display panel 100 has an area S2. In an embodiment of the present disclosure, S1:S2=1. For the sake of S1:S2=1, dummy driving units 34 may be provided in the second display region X2. The dummy driving units 34 are formed into dummy driving unit columns 341 along the first direction. The number of the dummy driving unit columns 341 is the same as the number of second sub-first driving unit columns 321. That is, the number of the second sub-first driving unit columns 321 in the first display region X1 is the same as the number of the dummy driving unit columns 341 in the second display region X2. Therefore, the first display region X1 and the second display region X2 in the display panel 100 have a same number of driving unit columns formed by the driving units 30.

Upon that, any one of the dummy driving unit columns 341 and a corresponding one of the second sub-first driving unit columns 321 may further be arranged in a same column along the first direction. The third driving units 33 in the first display region X1 may also be adjacent to the second display sub-region X12, and may be symmetrically provided at two sides of the second display sub-region X12 along the second direction, such that nearly all of the first data lines 51 are straight lines when extending along the first direction, and only some second data lines 52 are provided with the inclination portion (the second inclination portion 521). In this way, more driving units 30 and nearly all first data lines 51 can be manufactured in a same process, and the overall manufacturing process of the display panel 100 is simpler.

With the above structure, the driving units 30 and the data lines in more driving unit columns of the display panel 100 are manufactured regularly. This simplifies manufacture of related structures, and ensures conciseness of traces in the display panel 100. The regularly manufactured driving units 30 and the regularly manufactured data lines have a same size. This can ensure that the whole display region 10 has a same reflectivity, and improves display uniformity of the display panel 100.

Referring to FIG. 6 to FIG. 8, optionally, when S1:S2=1, the second display region X2 includes dummy driving units 34. The dummy driving units 34 are formed into dummy driving unit columns 341 along the first direction. The number of the dummy driving unit columns 341 is the same as the number of second sub-first driving unit columns 321 formed by the second driving units 32.

The dummy driving unit columns 341 are reused as a restoration circuit.

According to the display panel 100 provided by the present disclosure, in the first display region X1, the orthographic projection of the driving unit 30 on the light exit surface of the display panel 100 has an area S1. In the second display region X2, the orthographic projection of the driving unit 30 on the light exit surface of the display panel 100 has an area S2. In an embodiment of the present disclosure, S1:S2=1. For the sake of S1:S2=1, dummy driving units 34 may be provided in the second display region X2. The dummy driving units 34 are formed into dummy driving unit columns 341 along the first direction. The number of the dummy driving unit columns 341 is the same as the number of second sub-first driving unit columns 321. That is, the number of the second sub-first driving unit columns 321 in the first display region X1 is the same as the number of the dummy driving unit columns 341 in the second display region X2. Therefore, the first display region X1 and the second display region X2 in the display panel 100 have a same number of driving unit columns formed by the driving units 30. Any one of the dummy driving unit columns 341 and a corresponding one of the second sub-first driving unit columns 321 may further be arranged in a same column along the first direction.

In an embodiment of the present disclosure, the dummy driving unit columns 341 are reused as a restoration circuit. According to the prior art, the restoration circuit is provided in a non-display region of the display panel, namely in a peripheral bezel of the display region. In the present disclosure, the dummy driving unit columns 341 are reused as a restoration circuit. This prevents excessive space occupation to the display panel 100 due to a fact that the dummy driving units 34 and the restoration circuit are all provided in the display panel 100, simplifies manufacture of the display panel 100, and can meet design requirements of users on a narrow bezel of the display panel 100.

With the above structure, the driving units 30 and the data lines in each driving unit column are manufactured regularly. The dummy driving unit columns 341 are reused. This simplifies manufacture of related structures, and ensures conciseness of traces in the display panel 100. The regularly manufactured driving units 30 and the regularly manufactured data lines have a same size. This can ensure that the whole display region 10 has a same reflectivity, and improves display uniformity of the display panel 100.

Referring to FIG. 2, FIG. 6 and FIG. 7, optionally, the first display region X1 includes multiple first driving unit columns 311 extending along the first direction, and arranged along the second direction.

The first driving unit columns 311 each include first sub-first driving unit columns 3111 and second sub-first driving unit columns 321. The first sub-first driving unit columns 3111 each include the first driving units 31. The second sub-first driving unit columns 321 each include the second driving units 32.

At least one of the second sub-first driving unit columns 321 is provided between at least two adjacent ones of the first sub-first driving unit columns 3111.

In an embodiment of the present disclosure, there are driving unit columns including the first driving units 31, and driving unit columns including the second driving units 32. A plurality of first driving unit columns 311 extending along the first direction in the first display region X1 each include first sub-first driving unit columns 3111 formed by multiple first driving units 31 and second sub-first driving unit columns 321 formed by multiple second driving units 32. Any one of the second sub-first driving unit columns 321 may be located between two adjacent ones of the first sub-first driving unit columns 3111. It is to be noted that the number of the second sub-first driving unit columns 321 in the first display region X1 is not defined in the present disclosure, and can be set according to the number of columns of the second sub-pixels 22 in the second display sub-region X12. Positions of the second sub-first driving unit columns 321 in the first display region X1 are not defined in the present disclosure, and can be adjusted correspondingly according to actual design requirements of the display panel 100.

Referring to FIG. 8, optionally, the first display region X1 includes multiple first driving unit columns 311 extending along the first direction, and arranged along the second direction.

The first driving unit columns 311 each include first sub-first driving unit columns 3111 and second sub-first driving unit columns 321. The first sub-first driving unit columns 3111 each include the first driving units 31. The second sub-first driving unit columns 321 each include the second driving units 32.

At least one of the second sub-first driving unit columns 321 is located between the first sub-first driving unit column 3111 and the second display sub-region X12.

In an embodiment of the present disclosure, there are driving unit columns including the first driving units 31, and driving unit columns including the second driving units 32. A plurality of first driving unit columns 311 extending along the first direction in the first display region X1 each include first sub-first driving unit columns 3111 formed by multiple first driving units 31 and second sub-first driving unit columns 321 formed by multiple second driving units 32. At least one of the second sub-first driving unit columns 321 may be located between two adjacent ones of the first sub-first driving unit columns 3111. At least one of the second sub-first driving unit columns 321 may be adjacent to the second display sub-region X12, namely at least one of the second sub-first driving unit columns 321 is located between the first sub-first driving unit column 3111 and the second display sub-region X12, such that the second first driving unit sub-column 321 can be closer to the second display sub-region X12 in the second direction, the length of the second inclination portion 521 of the second data line 52 corresponding to the second first driving unit sub-column 321 is reduced, and the inclination angle of the second inclination portion 521 of the second data line 52 corresponding to the second first driving unit sub-column 321 relative to the first direction is reduced. This simplifies manufacture of related structures, and ensures simple arrangement of components such as traces in the display panel 100.

It is to be noted that the number of other second sub-first driving unit columns 321 in the first display region X1 is not defined in the present disclosure, and can be set according to the number of columns of the second sub-pixels 22 in the second display sub-region X12. Positions of the other second sub-first driving unit columns 321 in the first display region X1 are not defined in the present disclosure, and can be adjusted correspondingly according to actual design requirements of the display panel 100.

Figure 9:
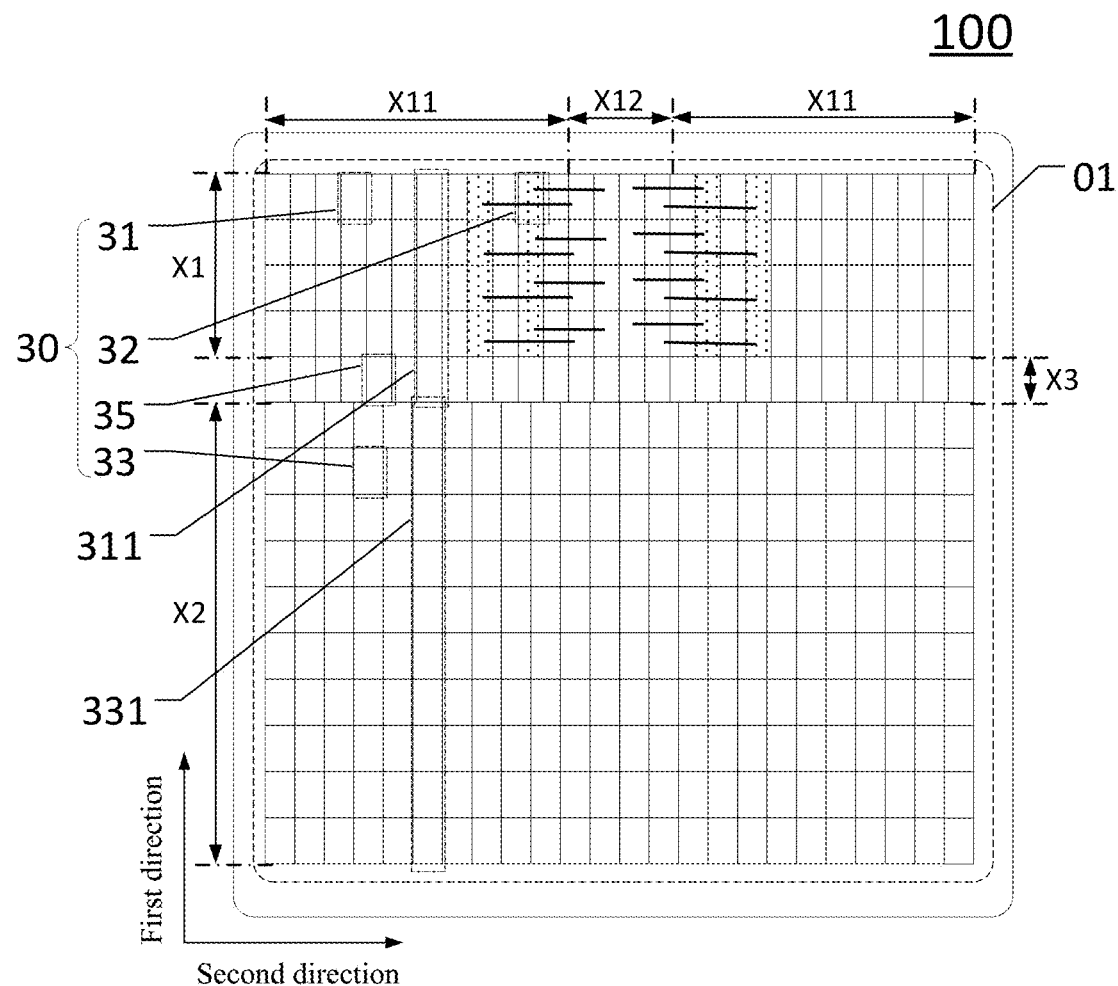
FIG. 9 is a schematic view of a display panel according to an embodiment of the present disclosure.
Figure 10:
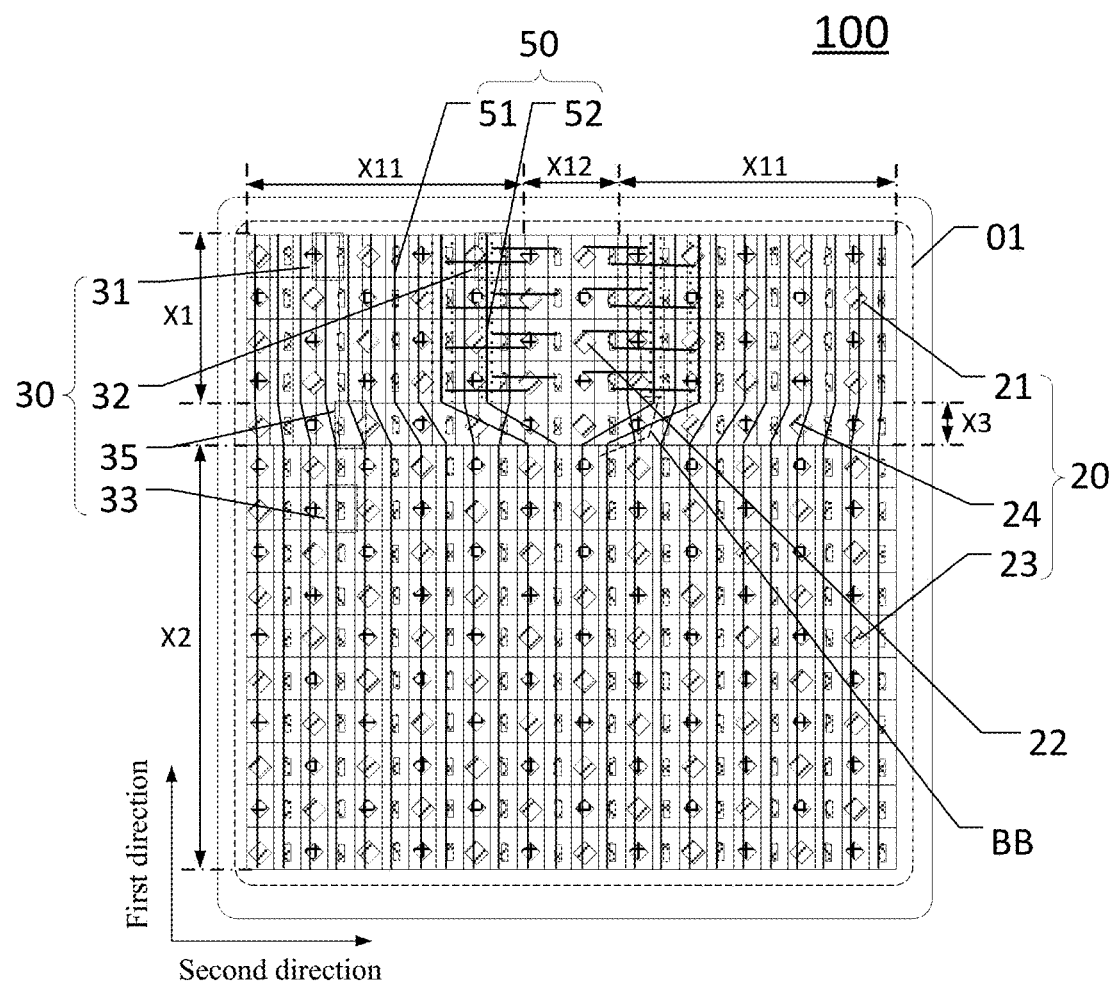
FIG. 10 is a schematic view of a display panel according to an embodiment of the present disclosure.
Figure 11:
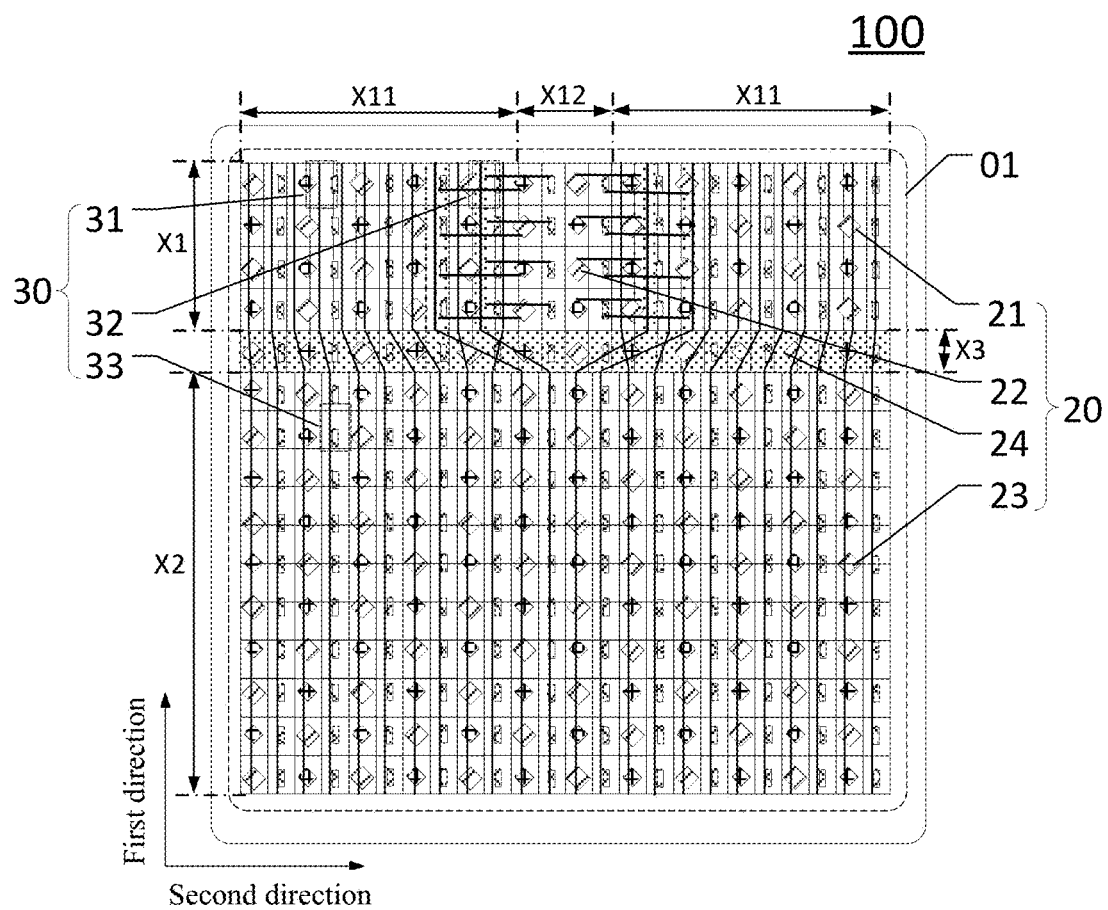
FIG. 11 is a schematic view of a display panel according to an embodiment of the present disclosure.

FIG. 9 is a schematic view of a display panel according to an embodiment of the present disclosure. FIG. 10 is a schematic view of a display panel according to an embodiment of the present disclosure. FIG. 11 is a schematic view of a display panel according to an embodiment of the present disclosure. Referring to FIG. 9 to FIG. 11, optionally, the display panel further includes a third display region X3. The third display region X3 is located between the first display region X1 and the second display region X2.

The third display region X3 includes at least one row of fourth sub-pixels 24 arranged along the second direction. The fourth sub-pixels 24 are electrically connected to the third driving units 33 in one-to-one correspondence. The third driving units 33 are also configured to respectively drive the electrically connected fourth sub-pixels 24 to emit light.

The third sub-pixels 23 and the fourth sub-pixels 24 are arranged in an array in the second display region X2 and the third display region X3.

In a further optional embodiment of the present disclosure, on the basis of the first display region X1 and the second display region X2, the display panel 100 further includes a third display region X3 between the first display region X1 and the second display region X2. The third display region X3 may include at least one row of fourth sub-pixels 24 arranged along the second direction. As shown in FIG. 11, the number of driving unit rows formed by the driving units 30 in the second display region X2 is greater than the number of sub-pixel rows formed by the sub-pixels 20 in the second display region X2 by one row. Hence, the excessive one driving unit row in the second display region X2 may be electrically connected to the fourth sub-pixels 24 in the third display region X3. That is, the fourth sub-pixels 24 are electrically connected to the third driving units 33 in the second display region X2 in one-to-one correspondence, and the third driving units 33 are also configured to respectively drive the electrically connected fourth sub-pixels 24 to emit light. In other words, when the third display region X3 includes one row of fourth sub-pixels 24, one row of the third driving units 33 are further provided in the second display region X2. In this case, the third display region X3 may be unnecessarily provided with the driving units 30, and the third display region X3 may be only configured to provide the first inclination portion 511 of the first data line 51 and the second inclination portion 521 of the second data line 52. This prevents coupling influences of the first inclination portion 511 and the second inclination portion 521 on other structural parts in the region, and ensures a desirable display effect of the display panel 100.

In addition, after the third display region X3 is provided, all sub-pixels 20 in the whole display region 10 are arranged uniformly, and the sub-pixels 20 are respectively electrically connected to the driving units 30, thereby ensuring uniform display of the display panel 100.

Figure 12:
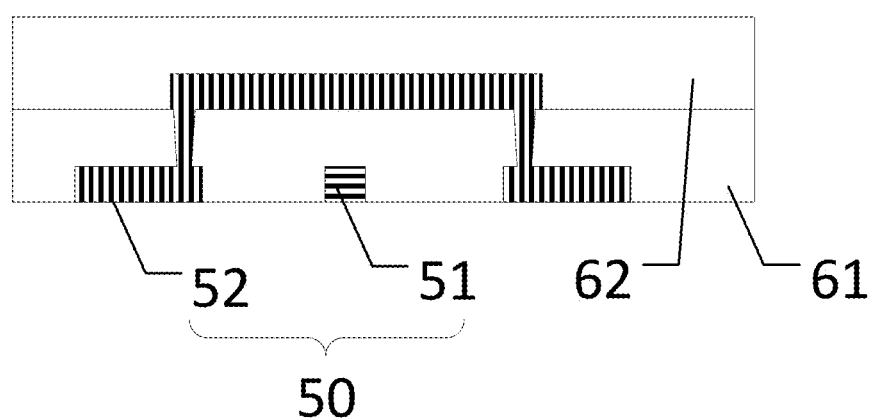
FIG. 12 is a cross-sectional view along BB' shown in FIG. 10 according to an embodiment of the present disclosure.

FIG. 12 is a cross-sectional view along BB' shown in FIG. 10 according to an embodiment of the present disclosure. Referring to FIG. 9 to FIG. 12, optionally, the display panel 100 includes multiple data lines 50 extending along the first direction, and arranged along the second direction.

The display panel 100 includes a first metal layer 61 and a second metal layer 62.

At least one of the data lines 50 is located on the first metal layer 61 in the first display region X1 and the second display region X2, and located on the second metal layer 62 in the third display region X3.

In a further optional embodiment of the present disclosure, on the basis of the first display region X1 and the second display region X2, the display panel 100 further includes a third display region X3 between the first display region X1 and the second display region X2. The display panel 100 includes at least two metal layers, such as a first metal layer 61 and a second metal layer 62 stacked in a thickness direction of the display panel 100. When at least one of the data lines 50 extends along the first direction, the data line 50 in the first display region X1 and the second display region X2 is provided on the first metal layer 61, and the data line 50 in the third display region X3 is provided on the second metal layer 62. That is, at least one of the data lines 50 is traced in a cross-layer manner in the third display region X3. Therefore, at least one of the data lines 50 has an overlapping area at some position in the third display region X3, and various tracing manners of the data line 50 in the third display region X3 can also be ensured.

It is to be noted that the first metal layer 61 may be a trace layer M3 in the display panel 100. With the trace layer M3 for providing the data line 50, a load on the data line 50 can be reduced to some extent compared with other metal layers. The second metal layer 62 may be any one of a trace layer M1, a trace layer MC, and a trace layer M2 in the display panel 100. That is, the first data line 51 and the second data line 52 can be traced through the trace layer M3 in the first display region X1 and the second display region X2. The data line 50 to be traced in a cross-layer manner in the third display region X3 can be jumped to any one of the trace layer M1, the trace layer MC, and the trace layer M2 for tracing. The trace layer M1, the trace layer MC, the trace layer M2 and the trace layer M3 are provided from top to bottom in the thickness direction of the display panel 100, and are equivalent to a first trace layer to a fourth trace layer.

Referring to FIG. 9 to FIG. 12, optionally, the display region 10 includes multiple first data lines 51 and multiple second data lines 52 extending along the first direction. The first data lines 51 are respectively electrically connected to the third sub-pixels 23, the first sub-pixels 21 and the fourth sub-pixels 24. The second data lines 52 are respectively electrically connected to the third sub-pixels 23, the second sub-pixels 22 and the fourth sub-pixels 24.

The display panel 100 includes a first metal layer 61 and a second metal layer 62.

The second data lines 52 are located on the first metal layer 61 in the first display region X1 and the second display region X2, and located on the second metal layer 62 in the third display region X3.

In a further optional embodiment of the present disclosure, on the basis of the first display region X1 and the second display region X2, the display panel 100 further includes a third display region X3 between the first display region X1 and the second display region X2. The display panel 100 includes at least two metal layers, such as a first metal layer 61 and a second metal layer 62 stacked in a thickness direction of the display panel 100. The first data lines 51 are located on the first metal layer 61, and the second data lines 52 are partially located on the first metal layer 61 in the first display region X1 and the second display region X2, and are partially located on the second metal layer 62 in the third display region X3. That is, the second data lines 52 in the third display region X3 are traced in a cross-layer manner, such that at least one of the first data lines 51 and at least one of the second data lines 52 have an overlapping area at some position in the third display region X3. Therefore, various tracing manners of the first data lines 51 and the second data lines 52 in the third display region X3 can be ensured, and a normal function of each data line is ensured.

Referring to FIG. 9 and FIG. 10, optionally, the display panel further includes a third display region X3. The third display region X3 is located between the first display region X1 and the second display region X2.

The third display region X3 includes at least one row of fourth sub-pixels 24 arranged along the second direction. The third display region X3 further includes fourth driving units 35. The fourth driving units 35 are in one-to-one correspondence with the fourth sub-pixels 24.

The display panel 100 further includes multiple data lines 50 extending along the first direction, and arranged along the second direction.

In the third display region X3, the fourth driving units 35 and the data lines 50 are provided on different layers.

In a further optional embodiment of the present disclosure, on the basis of the first display region X1 and the second display region X2, the display panel 100 further includes a third display region X3 between the first display region X1 and the second display region X2. The third display region X3 includes at least one row of fourth sub-pixels 24 arranged along the second direction, and further includes at least one row of fourth driving units 35 arranged along the second direction. The number of the fourth driving units 35 is the same as the number of the fourth sub-pixels 24. The fourth driving units 35 are configured to drive the electrically connected fourth sub-pixels 24 in one-to-one correspondence. In the embodiment, the driving units 30 are provided in the third display region X3. The fourth driving units 35 and the data lines 50 in the third display region X3 may be provided on different layers, such that the fourth driving units 35 and the data lines 50 are provided in the third display region X3 at the same time. This can ensure that the whole display region 10 has a nearly same reflectivity, and improves display uniformity of the display panel 100.

Referring to FIG. 4, optionally, the display region 10 includes multiple first data lines 51 and multiple second data lines 52 extending along the first direction. The first data lines 51 are respectively electrically connected to the third sub-pixels 23 and the first sub-pixels 21. The second data lines 52 are respectively electrically connected to the third sub-pixels 23 and the second sub-pixels 22.

When S1:S2<1, at least one of the first data lines 51 includes a first inclination portion 511. An extension direction of the first inclination portion 511 intersects with the first direction. The second data lines 52 each include a second inclination portion 521. An extension direction of the second inclination portion 521 intersects with the first direction.

The display panel 100 includes a first metal layer 61 and a second metal layer 62.

The second inclination portion 521 at a side of the second display region X2 close to the first display region X1 is located on the second metal layer 62. The first data line 51 is located on the first metal layer 61. The second data line 52 located in the first display region X1, and located at a side of the second display region X2 away from the first display region X1 is located on the first metal layer 61.

In an embodiment of the present disclosure, the display region 10 includes multiple first data lines 51 and multiple second data lines 52 extending along the first direction. Through the first data lines 51, each column of the third sub-pixels 23 and each column of the first sub-pixels 21 that extend along the first direction are electrically connected. Through the second data lines 52, each column of the third sub-pixels 23 and each column of the second sub-pixels 22 that extend along the first direction are electrically connected. Orientations of data lines 50 in the display region 01 depend on orientations of the driving units 30. According to the display panel 100 provided by the present disclosure, in the first display region X1, the orthographic projection of the driving unit 30 on the light exit surface of the display panel 100 has an area S1. In the second display region X2, the orthographic projection of the driving unit 30 on the light exit surface of the display panel 100 has an area S2. In an embodiment of the present disclosure, S1:S2<1. In this case, as shown in FIG. 4, at least one of the first data lines 51 includes a first inclination portion 511 located at a side of the second display region X2 close to the first display region X1, and the second data lines 52 each include a second inclination portion 521 located at the side of the second display region X2 close to the first display region X1. An extension direction of the first inclination portion 511 and an extension direction of the second inclination portion 521 intersect with the first direction.

The display panel 100 includes at least two metal layers (not shown), such as a first metal layer 61 and a second metal layer 62 stacked in a thickness direction of the display panel 100. When at least one of the data lines extends along the first direction, the first inclination portion 511 of the first data line 51 and the second inclination portion 521 of the second data line 52 may be located in the second display region X2, and at the side of the second display region X2 close to the first display region X1. The second inclination portion 521 may be located on the second metal layer 62. The first data line 51, the first inclination portion 511, and other portions of the second data line 52 rather than the second inclination portion 521 may be located on the first metal layer 61. Therefore, when at least one of the first data lines 51 and at least one of the second data lines 52 have an overlapping area at some position in the second display region X2 and at the side of the second display region X2 close to the first display region X1, various tracing manners for the first data line 51 and the second data line 52 in the second display region X2 and at the side of the second display region X2 close to the first display region X1 can be ensured, and a normal function of each data line is ensured.

It is to be noted that the first metal layer 61 may be a trace layer M3 in the display panel 100. With the trace layer M3 for providing the data line, a load on the data line can be reduced to some extent compared with other metal layers. The second metal layer 62 may be any one of a trace layer M1, a trace layer MC, and a trace layer M2 in the display panel 100. That is, the first data line 51 and the second data line 52 except the second inclination portion 521 can be traced through the trace layer M3. The second inclination portion 521 can be jumped to any one of the trace layer M1, the trace layer MC, and the trace layer M2 for tracing. The trace layer M1, the trace layer MC, the trace layer M2 and the trace layer M3 are provided from top to bottom in the thickness direction of the display panel 100, and are equivalent to a first trace layer to a fourth trace layer.

Figure 13:
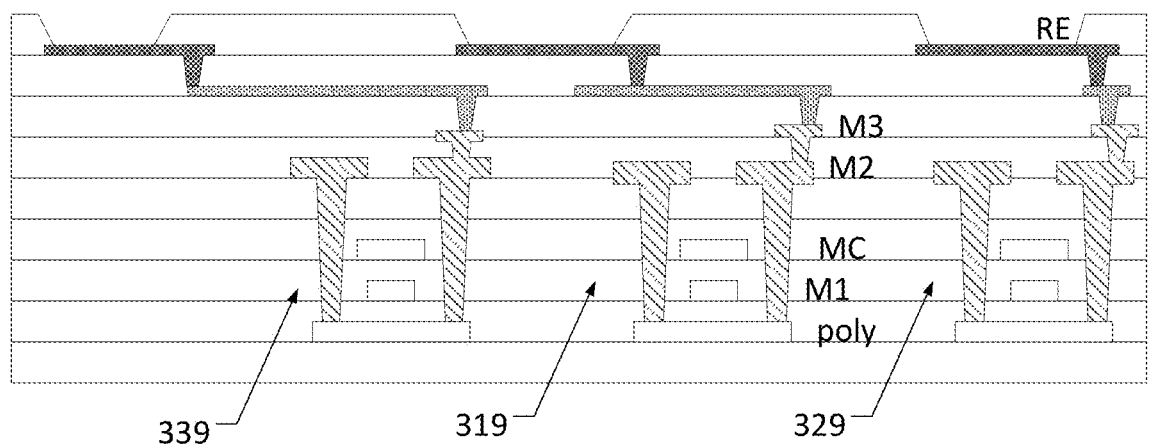
FIG. 13 is a partial cross-sectional view of a display panel according to an embodiment of the present disclosure.

FIG. 13 is a partial cross-sectional view of a display panel according to an embodiment of the present disclosure. Referring to FIG. 3 and FIG. 13, optionally, the first driving units 31 each include a first driving transistor 319. The first driving transistor 319 includes a first channel region. The first channel region has a width-to-length ratio R1. The second driving units 32 each include a second driving transistor 329. The second driving transistor 329 includes a second channel region. The second channel region has a width-to-length ratio R2. The third driving units 33 each include a third driving transistor 339. The third driving transistor 339 includes a third channel region. The third channel region has a width-to-length ratio R3, R3>R1, and R3>R2.

In the second display region X2, offsets between the driving units 30 and corresponding light-emitting elements are large, and anode RE connecting lines are long. Offsets between multiple driving units 30 close to the second display sub-region X12 in the first display region X1 and corresponding light-emitting elements are small, and anode RE connecting lines are short. Offsets between other driving units 30 in the first display region X1 and corresponding light-emitting elements are greater than the offsets between multiple driving units 30 close to the second display sub-region X12 in the first display region X1 and the corresponding light-emitting elements. For the sake of a high light transmittance of the second display sub-region X12, light-emitting elements in the second display sub-region X12 and close to the second display sub-region X12 in the first display region X1 have a minimum area. For the sake of display uniformity of the display panel 100, and in view of a load of an anode RE and an area of any one of the light-emitting elements, when S1:S2<1, the width-to-length ratio of the third channel region of the third driving transistor 339 in the second display region X2 is greater than the width-to-length ratio of the first channel region of the first driving transistor 319 in the first display region X1, and greater than the width-to-length ratio of the second channel region of the second driving transistor 329 in the first display region X1, thereby ensuring a desirable display effect of the display panel 100.

Referring to FIG. 13 and FIG. 3, optionally, the display region 10 includes multiple first data lines 51 and multiple second data lines 52 extending along the first direction. The first data lines 51 are respectively electrically connected to the third sub-pixels 23 and the first sub-pixels 21. The second data lines 52 are respectively electrically connected to the third sub-pixels 23 and the second sub-pixels 22.

When S1:S2<1, at least one of the first data lines 51 includes a first inclination portion 511. An extension direction of the first inclination portion 511 intersects with the first direction. The second data lines 52 each include a second inclination portion 521. An extension direction of the second inclination portion 521 intersects with the first direction.

The display panel 100 includes a substrate. The sub-pixel 20 includes an anode metal layer RE at one side of the substrate. Orthographic projection of the second inclination portion 521 on a plane of the substrate does not overlap with orthographic projection of the anode metal layer RE on the plane of the substrate.

In an embodiment of the present disclosure, the display region 10 includes multiple first data lines 51 and multiple second data lines 52 extending along the first direction. Through the first data lines 51, each column of the third sub-pixels 23 and each column of the first sub-pixels 21 that extend along the first direction are electrically connected. Through the second data lines 52, each column of the third sub-pixels 23 and each column of the second sub-pixels 22 that extend along the first direction are electrically connected. Orientations of data lines 50 in the display region 01 depend on orientations of the driving units 30. According to the display panel 100 provided by the present disclosure, in the first display region X1, the orthographic projection of the driving unit 30 on the light exit surface of the display panel 100 has an area S1. In the second display region X2, the orthographic projection of the driving unit 30 on the light exit surface of the display panel 100 has an area S2. In an embodiment of the present disclosure, S1:S2<1. In this case, as shown in FIG. 3, at least one of the first data lines 51 includes a first inclination portion 511 located at a side of the second display region X2 close to the first display region X1, and the second data lines 52 each include a second inclination portion 521 located at the side of the second display region X2 close to the first display region X1. An extension direction of the first inclination portion 511 and an extension direction of the second inclination portion 521 intersect with the first direction.

The display panel 100 provided by the present disclosure includes a substrate. A light-emitting element provided on the substrate includes an anode metal layer RE. In order to prevent the inclination portion of the data line from affecting a flatness of an anode, in an embodiment of the present disclosure, the data line is traced in polyline. This prevents an overlapping area between the data line and the anode metal layer RE, prevents the data line from affecting the flatness of the anode, ensures an overall reflectivity of the display panel 100, avoids obvious color cast of the display panel 100, and ensures display uniformity of the display panel 100.

In addition, if at least a portion of the data line has an overlapping area with the anode of the sub-pixel 20, for example, the second inclination portion 521 has an overlapping area with the anode of the sub-pixel 20, a path of the second inclination portion 521 can divide the anode of the sub-pixel 20 equally as much as possible. Consequently, while overlapping with the second inclination portion 521, the anode of the sub-pixel 20 has a symmetrical reflectivity. This can reduce an influence of the second inclination portion 521 on a uniform reflectivity of the display panel 100. Further, along the second direction, and at two sides of a midline of the display panel 100, if multiple data lines have an overlapping area with the anode of the sub-pixel 20, the overlapping area is symmetric with respect to the midline of the display panel 100 as a symmetric axis. Consequently, influences of the data lines on a reflectivity of the display panel 100 along the second direction are distributed symmetrically, and display effects of the display panel 100 along the second direction with the midline of the display panel 100 as a symmetric axis are symmetric. Compared with a condition in which overlapping areas between the data lines and the anode of the sub-pixel 20 are scattered, this can prevent obvious color cast of the display panel 100, and improve display effect of the display panel 100.

In addition, if at least a portion of the data line has an overlapping area with the anode of the sub-pixel 20, the data line may have an overlapping area with the whole anode of the corresponding sub-pixel 20. This prevents a protrusive region or a recessed region on the anode, can reduce influences on a reflectivity of the whole display panel 100, prevents obvious color cast of the display panel 100, and ensures the whole display effect of the display panel 100.

It is further to be noted that in order to prevent influences of the second inclination portion 521 on a potential at a node N1 (first node) in the sub-pixel 20, in an embodiment of the present disclosure, a metal member is provided in the trace layer M3 above the trace layer M2 corresponding to the node N1. While covering the trace layer M2 associated with the node N1 and a poly layer, the metal member is electrically connected to a PVDD signal line in the sub-pixel 20. This prevents the influences of the second inclination portion 521 on the potential at the node N1, and ensures working performance of the display panel 100 and the display effect of the display panel 100.

In addition, in order to prevent influences of the second inclination portion 521 on a potential at a node N1 in the sub-pixel 20, the second inclination portion 521 may avoid the trace layer M2 corresponding to the node N1 and the poly layer. That is, the second inclination portion 521 does not have an overlapping area with the trace layer M2 corresponding to the node N1 and the poly layer in the display panel 100. This prevents the influences of the second inclination portion 521 on the potential at the node N1, and ensures working performance of the display panel 100 and the display effect of the display panel 100.

Referring to FIG. 3, optionally, the display region 10 includes multiple first data lines 51 and multiple second data lines 52 extending along the first direction. The first data lines 51 are electrically connected to the third sub-pixels 23 and the first sub-pixels 21. The second data lines 52 are electrically connected to the third sub-pixels 23 and the second sub-pixels 22.

When S1:S2<1, at least one of the first data lines 51 includes a first inclination portion 511. An extension direction of the first inclination portion 511 intersects with the first direction. The second data lines 52 each include a second inclination portion 521. An extension direction of the second inclination portion 521 intersects with the first direction.

The display panel 100 includes a substrate. Orthographic projection of the second inclination portion 521 on a plane of the substrate overlaps with orthographic projection of at least one of the third sub-pixels 23 on the plane of the substrate. In the same display panel 100, the third sub-pixel 23 correspondingly overlapping with the second inclination portion 521 is a first color sub-pixel 20.

In an embodiment of the present disclosure, the display region 10 includes multiple first data lines 51 and multiple second data lines 52 extending along the first direction. Through the first data lines 51, each column of the third sub-pixels 23 and each column of the first sub-pixels 21 that extend along the first direction are electrically connected. Through the second data lines 52, each column of the third sub-pixels 23 and each column of the second sub-pixels 22 that extend along the first direction are electrically connected. Orientations of data lines 50 in the display region 01 depend on orientations of the driving units 30. According to the display panel 100 provided by the present disclosure, in the first display region X1, the orthographic projection of the driving unit 30 on the light exit surface of the display panel 100 has an area S1. In the second display region X2, the orthographic projection of the driving unit 30 on the light exit surface of the display panel 100 has an area S2. In an embodiment of the present disclosure, S1:S2<1. In this case, as shown in FIG. 3, at least one of the first data lines 51 includes a first inclination portion 511 located at a side of the second display region X2 close to the first display region X1, and the second data lines 52 each include a second inclination portion 521 located at the side of the second display region X2 close to the first display region X1. An extension direction of the first inclination portion 511 and an extension direction of the second inclination portion 521 intersect with the first direction.

The display panel 100 provided by the present disclosure includes a substrate. Second inclination portions 521 of all second data lines 52 in the display panel 100 may have an overlapping area with the third sub-pixels 23 of a same color. If the second inclination portions 521 have an adverse effect on display effect of the third sub-pixels 23 that have the overlapping area with the second inclination portions and have the same color, only the sub-pixels 20 of a same color are compensated to solve the display problem of the display panel 100 and improve display uniformity of the display panel 100. There is no need to respectively compensate the sub-pixels 20 of different colors. This reduces manufacture and complex control of the display panel 100, and achieves a desirable display effect of the display panel 100 in a simple method.

Figure 14:
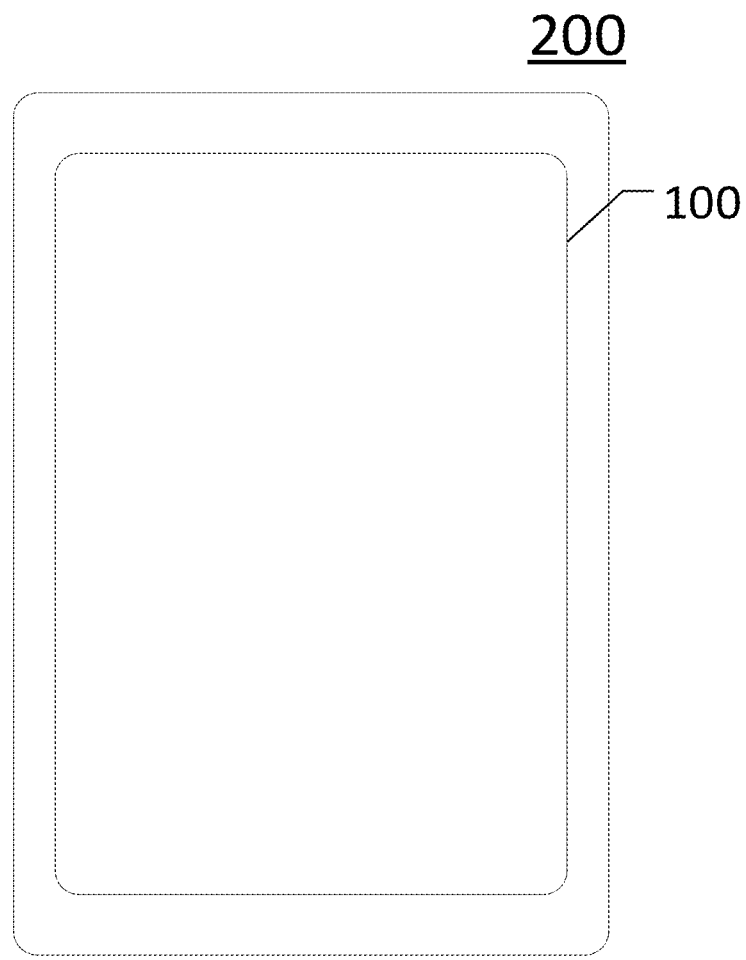
FIG. 14 is a schematic view of a display apparatus according to an embodiment of the present disclosure.

FIG. 14 is a schematic view of a display apparatus according to an embodiment of the present disclosure. Referring to FIG. 1 to FIG. 13 and FIG. 14, based on the same inventive conception, the present disclosure further provides a display apparatus 200. The display apparatus 200 includes a display panel 100. The display panel 100 is any display panel 100 provided by the present disclosure.

It should be noted that for the embodiment of the display apparatus 200 provided by the present disclosure, reference can be made to the embodiment of the display panel 100 described above, and repeated parts are not described again. The display apparatus 200 provided in the present disclosure may be any product or component with a display function, such as a mobile phone, a tablet computer, a television, a display screen, a laptop computer or a navigator.

According to the above embodiments, the display panel and display apparatus provided by the present disclosure at least achieve the following beneficial effects:

According to the display panel and the display apparatus provided by the present disclosure, second driving units electrically connected to second sub-pixels in a second display sub-region for providing a photosensitive element are provided outside the second display sub-region, thereby preventing occupation of the second driving units for the second display sub-region. Orthographic projection of any one of the driving units in the first display region with the second display sub-region on a light exit surface of the display panel is less than or equal to orthographic projection of the driving unit in the second display region without the second display sub-region on the light exit surface of the display panel. Without changing light-emitting positions of the sub-pixels and the number of the sub-pixels in the display panel, the second driving units are provided outside the second display sub-region, and the second driving units are configured to drive the sub-pixels in the second display sub-region in one-to-one correspondence. Therefore, the present disclosure makes display of the display panel stable and uniform.

Although some embodiments of the present disclosure have been described in detail by way of examples, those skilled in the art should understand that the foregoing examples are merely for illustration, and are not intended to limit the scope of the present disclosure. Those skilled in the art should understand that modifications may be made to the foregoing embodiments without departing from the scope and spirit of the present disclosure. The scope of the present disclosure is defined by the appended claims.

What is claimed is:

1. A display panel, including: a display region,
wherein the display region comprises a first display region and at least one second display region that are arranged along a first direction; the first display region comprises a first display sub-region and at least one second display sub-region that are arranged along a second direction; and the at least one second display sub-region is provided with a photosensitive element;
wherein the display region comprises sub-pixels distributed in an array; the sub-pixels comprise first sub-pixels located in the first display sub-region, second sub-pixels located in the at least one second display sub-region, and third sub-pixels located in the at least one second display region;
wherein the display region further comprises driving units; the driving units comprise first driving units, second driving units, and third driving units; and the third driving units are located in the at least one second display region and are electrically connected to the third sub-pixels in one-to-one correspondence, so as to drive the third sub-pixels to emit light;
wherein the first driving units and the second driving units are located in the first display sub-region; the first driving units are electrically connected to the first sub-pixels in one-to-one correspondence, so as to drive the first sub-pixels to emit light; and the second driving units are electrically connected to the second sub-pixels in one-to-one correspondence, so as to drive the second sub-pixels to emit light;
wherein in the first display region, an orthographic projection of at least one of the driving units on a light exit surface of the display panel has an area S1, and in the at least one second display region, an orthographic projection of at least one of the driving units on the light exit surface of the display panel has an area S2, where ½<S1:S2≤1; and
wherein the first direction intersects with the second direction.

2. The display panel according to claim 1, wherein
the first display region comprises first driving unit columns extending along the first direction and arranged along the second direction;
the at least one second display region comprises second driving unit columns extending along the first direction and arranged along the second direction; and
when S1:S2<1, along the first direction, for a same column of the sub-pixels, a corresponding one first driving unit column of the first driving unit columns at least partially overlaps a corresponding one second driving unit column of the second driving unit columns.

3. The display panel according to claim 1, wherein
the display region comprises first data lines extending along the first direction and second data lines extending along the first direction; the first data lines are respectively electrically connected to the third sub-pixels and the first sub-pixels; and the second data lines are respectively electrically connected to the third sub-pixels and the second sub-pixels;
when S1:S2<1, at least one of the first data lines comprises a first inclination portion; an extension direction of the first inclination portion intersects with the first direction; one of the second data lines comprises a second inclination portion; and an extension direction of the second inclination portion intersects with the first direction; and
the first inclination portion has a length of L1 along the extension direction, and the second inclination portion has a length of L2 along the extension direction, where L1<L2.

4. The display panel according to claim 1, wherein
the display region comprises first data lines extending along the first direction and second data lines extending along the first direction; the first data lines are respectively electrically connected to the third sub-pixels and the first sub-pixels; and the second data lines are respectively electrically connected to the third sub-pixels and the second sub-pixels;
when S1:S2<1, at least one of the first data lines comprises a first inclination portion; an extension direction of the first inclination portion intersects with the first direction; one of the second data lines comprises a second inclination portion; and an extension direction of the second inclination portion intersects with the first direction; and
the first inclination portion has an inclination angle $\alpha 1$ relative to the first direction, and the second inclination portion has an inclination angle $\alpha 2$ relative to the first direction, where $\alpha 1 < \alpha 2$.

5. The display panel according to claim 1, wherein
the display region comprises first data lines extending along the first direction and second data lines extending along the first direction; the first data lines are respectively electrically connected to the third sub-pixels and the first sub-pixels; and the second data lines are respectively electrically connected to the third sub-pixels and the second sub-pixels;
when S1:S2<1, at least one of the first data lines comprises a first inclination portion; an extension direction of the first inclination portion intersects with the first direction; one of the second data lines comprise a second inclination portion; and an extension direction of the second inclination portion intersects with the first direction; and
along a direction pointing from the at least one second display sub-region to the first display sub-region, an inclination direction of the first inclination portion comprises the direction pointing from the at least one second display sub-region to the first display sub-region; and the inclination direction of the first inclination portion further comprises a direction pointing from the first display sub-region to the at least one second display sub-region.

6. The display panel according to claim 1, wherein
the display region comprises first data lines extending along the first direction and second data lines extending along the first direction; the first data lines are respectively electrically connected to the third sub-pixels and the first sub-pixels; and the second data lines are respectively electrically connected to the third sub-pixels and the second sub-pixels;
when S1:S2<1, at least one of the first data lines comprises a first inclination portion; an extension direction of the first inclination portion intersects with the first direction; one of the second data lines comprises a second inclination portion; and an extension direction of the second inclination portion intersects with the first direction; and
at least one of the first data lines is a straight line.

7. The display panel according to claim 6, wherein
the display region comprises a first region, a second region, and a third region that are sequentially arranged along the second direction; the second region is located between the first region and the third region; and at least one of the first data lines in the first region is a straight line, or, at least one of the first data lines in the third region is a straight line.

8. The display panel according to claim 1, wherein when S1:S2=1, the at least one second display region comprises dummy driving units; the dummy driving units are formed into dummy driving unit columns along the first direction; and a column number of the dummy driving unit columns is the same as a column number of second sub-first driving unit columns formed by the second driving units.

9. The display panel according to claim 1, wherein when S1:S2=1, the at least one second display region comprises dummy driving units; the dummy driving units are formed into dummy driving unit columns along the first direction; a column number of the dummy driving unit columns is the same as a column number of second sub-first driving unit columns formed by the second driving units; and the dummy driving unit columns and corresponding second sub-first driving unit columns are arranged in a same column along the first direction.

10. The display panel according to claim 1, wherein when S1:S2=1, the at least one second display region comprises dummy driving units; the dummy driving units are formed into dummy driving unit columns along the first direction; and a column number of the dummy driving unit columns is the same as a column number of second sub-first driving unit columns formed by the second driving units; and the dummy driving unit columns are reused as a restoration circuit.

11. The display panel according to claim 1, wherein the first display region comprises first driving unit columns extending along the first direction and arranged along the second direction;
one first driving unit column of the first driving unit columns comprises first sub-first driving unit columns and second sub-first driving unit columns; the first sub-first driving unit columns comprise the first driving units; and the second sub-first driving unit columns comprise the second driving units; and
at least one second sub-first driving unit column of the second sub-first driving unit columns is provided between at least two adjacent first sub-first driving unit columns of the first sub-first driving unit columns.

12. The display panel according to claim 1, wherein the first display region comprises first driving unit columns extending along the first direction and arranged along the second direction;
one first driving unit column of the first driving unit columns comprises first sub-first driving unit columns and second sub-first driving unit columns; the first sub-first driving unit columns comprise the first driving units; and the second sub-first driving unit columns comprise the second driving units; and
at least one second sub-first driving unit column of the second sub-first driving unit columns is located between the first sub-first driving unit column and the at least one second display sub-region.

13. The display panel according to claim 1, further comprising a third display region located between the first display region and the at least one second display region;
wherein the third display region comprises at least one row of fourth sub-pixels arranged along the second direction; the fourth sub-pixels are electrically connected to the third driving units in one-to-one correspondence; and the third driving units are configured to respectively drive the electrically connected fourth sub-pixels to emit light; and
the third sub-pixels and the fourth sub-pixels are arranged in an array in the at least one second display region and the third display region.

14. The display panel according to claim 13, further comprising:
data lines extending along the first direction and arranged along the second direction;
a first metal layer; and
a second metal layer;
wherein at least part of the data lines is located on the first metal layer in the first display region and the at least one second display region, and is located on the second metal layer in the third display region.

15. The display panel according to claim 13, further comprising:
first data lines extending along the first direction;
second data lines extending along the first direction;
a first metal layer; and
a second metal layer;
wherein the first data lines are respectively electrically connected to the third sub-pixels, the first sub-pixels and the fourth sub-pixels; and the second data lines are respectively electrically connected to the third sub-pixels, the second sub-pixels and the fourth sub-pixels; and
the second data lines are located on the first metal layer in the first display region and the at least one second display region, and located on the second metal layer in the third display region.

16. The display panel according to claim 1, further comprising: a third display region located between the first display region and the at least one second display region,
wherein the third display region comprises at least one row of fourth sub-pixels arranged along the second direction;
the third display region further comprises fourth driving units; and the fourth driving units are in one-to-one correspondence with the fourth sub-pixels;
the display panel further comprises data lines extending along the first direction and arranged along the second direction; and
in the third display region, the fourth driving units are provided on different layers from the data lines.

17. The display panel according to claim 1, further comprising a first metal layer and a second metal layer, wherein
the display region comprises first data lines extending along the first direction and second data lines extending along the first direction; the first data lines are respectively electrically connected to the third sub-pixels and the first sub-pixels; and the second data lines are respectively electrically connected to the third sub-pixels and the second sub-pixels;
when S1:S2<1, at least part of the first data lines comprises a first inclination portion; an extension direction of the first inclination portion intersects with the first direction; one of the second data lines comprise a second inclination portion; and an extension direction of the second inclination portion intersects with the first direction; and
a side of the second inclination portion close to the first display region in the at least one second display region is located on the second metal layer; the first data lines are located on the first metal layer; and the second data line located in the first display region and located at a side of the at least one second display region away from the first display region is located on the first metal layer.

18. The display panel according to claim 1, wherein one of the first driving units comprises a first driving transistor; the first driving transistor comprises a first channel region; the first channel region has a width-to-length ratio R1; one of the second driving units comprises a second driving transistor; the second driving transistor comprises a second channel region; the second channel region has a width-to-length ratio R2; one of the third driving units comprises a third driving transistor; the third driving transistor comprises a third channel region; and the third channel region has a width-to-length ratio R3, where R3>R1, and R3>R2.

19. The display panel according to claim 1, further comprising: a substrate; wherein
the display region comprises first data lines extending along the first direction and second data lines extending along the first direction; the first data lines are respectively electrically connected to the third sub-pixels and the first sub-pixels; and the second data lines are respectively electrically connected to the third sub-pixels and the second sub-pixels;
when S1:S2<1, at least part of the first data lines comprises a first inclination portion; an extension direction of the first inclination portion intersects with the first direction; one of the second data lines comprise a second inclination portion; and an extension direction of the second inclination portion intersects with the first direction; and
one of the sub-pixels comprises an anode metal layer located at a side of the substrate; an orthographic projection of the second inclination portion on a plane of the substrate does not overlap with an orthographic projection of the anode metal layer on the plane of the substrate.

20. The display panel according to claim 1, further comprising: a substrate; wherein
the display region comprises first data lines extending along the first direction and second data lines extending along the first direction; the first data lines are respectively electrically connected to the third sub-pixels and the first sub-pixels; and the second data lines are respectively electrically connected to the third sub-pixels and the second sub-pixels;
when S1:S2<1, at least part of the first data lines comprises a first inclination portion; an extension direction of the first inclination portion intersects with the first direction; one of the second data lines comprises a second inclination portion; and an extension direction of the second inclination portion intersects with the first direction; and
an orthographic projection of the second inclination portion on a plane of the substrate overlaps with an orthographic projection of at least one of the third sub-pixels on the plane of the substrate; and in a same display panel, the third sub-pixel correspondingly overlapping with the second inclination portion is a first color sub-pixel.

21. A display apparatus, comprising a display panel, wherein the display panel comprises a display region,
wherein the display region comprises a first display region and at least one second display region that are arranged along a first direction; the first display region comprises a first display sub-region and at least one second display sub-region that are arranged along a second direction; and the at least one second display sub-region is provided with a photosensitive element;
wherein the display region comprises sub-pixels distributed in an array; the sub-pixels comprise first sub-pixels located in the first display sub-region, second sub-pixels located in the at least one second display sub-region, and third sub-pixels located in the at least one second display region;
wherein the display region further comprises driving units; the driving units comprise first driving units, second driving units, and third driving units; and the third driving units are located in the at least one second display region and are electrically connected to the third sub-pixels in one-to-one correspondence, so as to drive the third sub-pixels to emit light;
wherein the first driving units and the second driving units are located in the first display sub-region; the first driving units are electrically connected to the first sub-pixels in one-to-one correspondence, so as to drive the first sub-pixels to emit light; and the second driving units are electrically connected to the second sub-pixels in one-to-one correspondence, so as to drive the second sub-pixels to emit light;
wherein in the first display region, an orthographic projection of at least one of the driving units on a light exit surface of the display panel has an area S1, and in the at least one second display region, an orthographic projection of at least one of the driving units on the light exit surface of the display panel has an area S2, where $\frac{1}{2}<S1:S2\leq 1$; and
wherein the first direction intersects with the second direction.

* * * * *